US012738928B2

(12) United States Patent
Bowman et al.

(10) Patent No.: US 12,738,928 B2
(45) Date of Patent: Sep. 15, 2026

(54) ADAPTIVE CLOCK DUTY CYCLE CONTROLLER (DCC) FOR AUTOMOTIVE SYSTEM-ON-A-CHIP (SOC)

(71) Applicant: QUALCOMM Incorporated, San Diego, CA (US)

(72) Inventors: Keith Alan Bowman, Morrisville, NC (US); Daniel Yingling, Apex, NC (US); Yimai Peng, Cary, NC (US); Amit Aneja, Chandler, AZ (US); Sagar Jariwala, San Marcos, CA (US); Dipti Ranjan Pal, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 128 days.

(21) Appl. No.: 18/823,631

(22) Filed: Sep. 3, 2024

(65) Prior Publication Data

US 2026/0066882 A1 Mar. 5, 2026

(51) Int. Cl.
*H03K 3/017* (2006.01)

(52) U.S. Cl.
CPC .................................... *H03K 3/017* (2013.01)

(58) Field of Classification Search
CPC ......... H03K 3/017; H03K 5/05; H03K 5/1565
USPC .......................................................... 327/175
See application file for complete search history.

(56) References Cited

U.S. PATENT DOCUMENTS

| | | | | |
|---|---|---|---|---|
| 5,452,215 | A * | 9/1995 | Washabaugh | G06F 7/00 700/98 |
| 9,450,609 | B1 * | 9/2016 | Schmit | H03M 13/05 |
| 12,033,686 | B2 * | 7/2024 | Moon | G11C 7/222 |
| 2014/0091841 | A1 * | 4/2014 | Ramaswami | H03K 23/42 327/115 |
| 2019/0007992 | A1 | 1/2019 | Kim et al. | |
| 2022/0392280 | A1 * | 12/2022 | Wei | G06F 11/0793 |
| 2023/0005515 | A1 * | 1/2023 | Kim | G11C 29/12015 |

OTHER PUBLICATIONS

Yingling et al. ("14.3 A 3nm Adaptive Clock Duty-Cycle Controller for Mitigating Aging-Induced Clock Duty-Cycle Distortion", 2024 IEEE International Solid-state Circuits Conference (ISSCC), IEEE, vol. 67, Feb. 18, 2024, pp. 258-260, XP034561758) (Year: 2024).*
International Search Report and Written Opinion—PCT/US2025/036861—ISA/EPO—Nov. 10, 2025.
Yingling D., et al., "14.3 A 3nm Adaptive Clock Duty-Cycle Controller for Mitigating Aging-Induced Clock Duty-Cycle Distortion", 2024 IEEE International Solid-state Circuits Conference (ISSCC), IEEE, vol. 67, Feb. 18, 2024, pp. 258-260, XP034561758, figures 14.3.1,14.3.2.

* cited by examiner

*Primary Examiner* — Regis J Betsch
*Assistant Examiner* — Amit R Bhatia
(74) *Attorney, Agent, or Firm* — Patterson & Sheridan, L.L.P.

(57) ABSTRACT

Aspects of the present disclosure relate to an adaptive clock duty cycle controller (DCC) in an automotive system-on-a-chip (SoC). The adaptive clock DCC may include one or more devices, which may be configured to measure and adapt a duty cycle of a clock signal to compensate for aging effects on components in a signal path of a clock distribution network.

20 Claims, 8 Drawing Sheets

820

Measure, by a duty cycle monitor (DCM) coupled to the plurality of DCAs, duty cycle distortion (DCD) of the duty cycle of the clock signal and/or duty cycle adjustments performed by the plurality of DCAs

ADAPTIVE CLOCK DUTY CYCLE CONTROLLER (DCC) FOR AUTOMOTIVE SYSTEM-ON-A-CHIP (SOC)

BACKGROUND

Field of the Disclosure

Aspects of the present disclosure relate generally to clock distribution, and more particularly, to duty cycle management in a clock distribution network.

Description of Related Art

A system may include a clock generator (e.g., a phase-locked loop (PLL)) configured to generate a clock signal for timing operations of one or more circuits (e.g., flip-flops) in the system. The system may also include a clock distribution network (also referred to as a clock tree) for distributing the clock signal from the clock generator to the one or more circuits. A challenge facing clock distribution is that PLL duty cycle variations, systematic system design limitations, random hardware faults, and/or aging (e.g., asymmetric aging) in one or more signal paths of the clock distribution network may cause a duty cycle distortion (DCD) in the clock signal, which may lead to timing issues (e.g., timing violations) in the one or more circuits.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure provide an apparatus for a self-checking test. The apparatus may include a plurality of duty cycle adjusters (DCAs) including at least a first DCA and a second DCA. Each DCA of the plurality of DCAs is configured to adjust a duty cycle of a clock signal and output the clock signal with an adjusted duty cycle. The apparatus may further include a duty cycle monitor (DCM) coupled to the plurality of DCAs. The DCM is configured to measure duty cycle distortion (DCD) of the duty cycle of the clock signal and duty cycle adjustments performed by the plurality of DCAs.

Certain aspects of the present disclosure provide an apparatus for a self-checking test. The apparatus may include a first DCA configured to perform distortion of a duty cycle of a clock signal and output the clock signal with a distorted duty cycle. The apparatus may further include a DCM configured to determine DCD based on measuring one or more parameters of the distorted duty cycle of the clock signal and output DCD measurements of the distorted duty cycle of the clock signal. The apparatus may further include a DCA adaptive controller configured to determine a duty cycle correction value based on the DCD measurements of the distorted duty cycle of the clock signal received from the DCM and output the duty cycle correction value. The apparatus may further include a second DCA configured to adjust the distorted duty cycle of the clock signal to a corrected duty cycle of the clock signal based on the duty cycle correction value received from the DCA adaptive controller.

Certain aspects of the present disclosure provide a method for a self-checking test. The method may include adjusting, by each of a plurality of DCAs including at least a first DCA and a second DCA, a duty cycle of a clock signal and output the clock signal with an adjusted duty cycle. The method may further include measuring, by a DCM coupled to the plurality of DCAs, DCD of the duty cycle of the clock signal and duty cycle adjustments performed by the plurality of DCAs.

Certain aspects of the present disclosure provide a method for a self-checking test. The method may include performing, by a first DCA, distortion of a duty cycle of a clock signal and outputting the clock signal with a distorted duty cycle. The method may further include determining, by a DCM, DCD based on measuring of one or more parameters of the distorted duty cycle of the clock signal and outputting DCD measurements of the distorted duty cycle of the clock signal. The method may further include determining, by a DCA adaptive controller, a duty cycle correction value based on the DCD measurements of the distorted duty cycle of the clock signal received from the DCM and outputting the duty cycle correction value. The method may further include adjusting, by a second DCA, the distorted duty cycle of the clock signal to a corrected duty cycle of the clock signal based on the duty cycle correction value received from the DCA adaptive controller.

Other aspects provide: an apparatus operable, configured, or otherwise adapted to perform the aforementioned methods as well as those described elsewhere herein; a non-transitory, computer-readable media comprising instructions that, when executed by one or more processors of an apparatus, cause the apparatus to perform the aforementioned methods as well as those described elsewhere herein; a computer program product embodied on a computer-readable storage medium comprising code for performing the aforementioned methods as well as those described elsewhere herein; and an apparatus comprising means for performing the aforementioned methods as well as those described elsewhere herein. By way of example, an apparatus may comprise a processing system, a device with a processing system, or processing systems cooperating over one or more networks.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
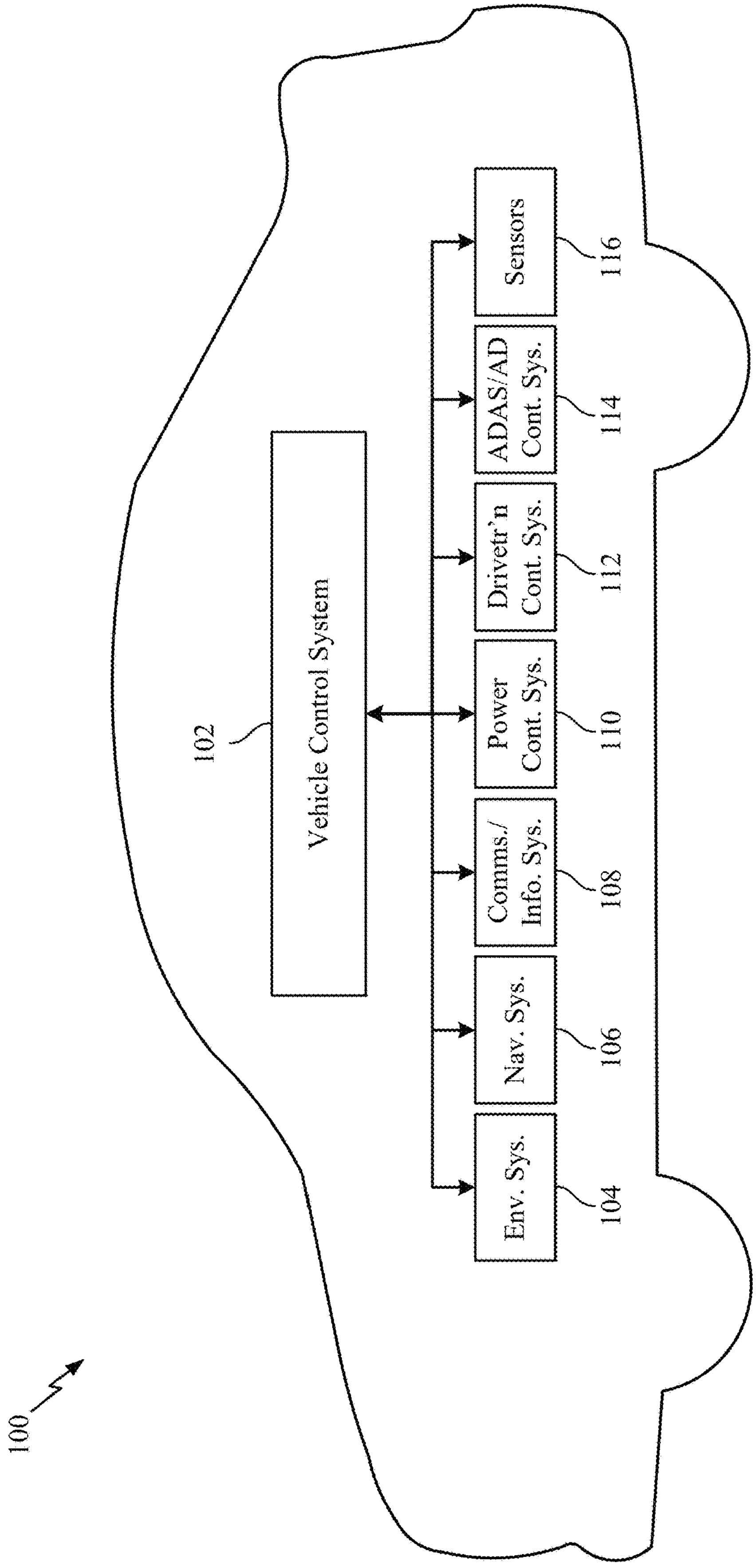
FIG. 1 is a diagram of an example vehicle with a vehicle control system, in which aspects of the present disclosure may be practiced.

A clock generator (e.g., a phase-locked loop (PLL) may generate a clock signal for timing operations of circuits (e.g., in an automotive systems-on-chip (SoC)). The clock signal may be a periodic signal that oscillates between high and low logic levels. The clock signal may have a duty cycle, which may be expressed as a percentage or a fraction of a clock period (i.e., a clock cycle) in which the clock signal is high (i.e., one).

A clock distribution network may be configured to distribute the clock signal from the clock generator to the circuits. The clock distribution network may receive the clock signal from the clock generator via its input (also referred to as a root node) of the clock distribution network and distributes the clock signal to the circuits via its outputs (also referred to as leaf nodes) of the clock distribution network.

The clock distribution network may include a clock path. The clock path may be a path through which the clock signal propagates, and may include one or more components such as glitch free (GF) multiplexers (MUX), an adaptive clock distribution (ACD) system, and clock gating circuits (CGCs). One challenge with the clock distribution network is that PLL duty cycle variations, systematic design limitations of the components in the clock distribution network, random hardware faults associated with the components in the clock distribution network, and/or aging of the components in the clock distribution network may cause duty cycle distortion (DCD) of the duty cycle of the clock signal at the leaf nodes. The DCD of the duty cycle of the clock signal may lead to timing issues (e.g., timing violations) in the circuits if not corrected.

Aspects of the present disclosure relate to an adaptive clock duty cycle controller (DCC) in the automotive SoC. The adaptive clock DCC may include one or more devices, which may be configured to measure and adapt the duty cycle of the clock signal to compensate for the aging effects on the components in the clock path of the clock distribution network. For example, the adaptive clock DCC may mitigate the DCD from the aging and other effects such as a PLL DCD or an intrinsic clock-distribution DCD.

To deploy the adaptive clock DCC into the automotive SoC, the adaptive clock DCC may be designed and configured to satisfy various automotive safety compliance requirements. For example, one or more safety-critical features implemented for deploying the adaptive clock DCC into the automotive SoC may include an end-to-end system self-checking test with two duty cycle adjusters (DCAs) circuits to enable in-field verification to detect hardware errors; a programmable safety feature to limit a magnitude of DCA duty cycle correction at the root node; a duty cycle monitor (DCM), a DCA, and adaptive control finite-state machines (FSMs) being implemented with a hamming code-based FSM-state encoding to detect invalid state transitions; DCC configuration registers implemented with a two-dimensional (2D) parity protection; and a clock-monitoring circuit associated with the DCC to detect any hardware faults.

Techniques proposed herein for duty cycle management in the clock distribution network may include multiple advantages. For example, the safety-critical features proposed herein may satisfy the various automotive safety compliance requirements, which may allow the adaptive clock DCC to be deployed in the automotive SoC. The adaptive clock DCC may enable on-die duty cycle measurement at the leaf node and duty cycle correction at the root node to compensate for aging-induced DCD. The adaptive clock DCC may be applicable to any automotive processor (e.g., a central processing unit (CPU), a graphics processing unit (GPU), etc.) where aging of the components may degrade the clock duty cycle.

Example Vehicle Control System

FIG. 1 is a block diagram of an example vehicle 100 including a vehicle control system 102 and various sensors suitable for controlling certain systems, such as an advanced driver assistance system (ADAS), automated driving (AD), and/or in-vehicle infotainment (IVI). The vehicle 100 may refer to a means of carrying or transporting something (e.g., a person and/or cargo). In some aspects, the vehicle 100 may represent a motor vehicle, such as a car, van, truck, semi-trailer truck, motorcycle, motorbike, moped, electric bicycle, etc. The vehicle 100 may be a series production road vehicle having safety-related systems that include one or more electrical and/or electronic systems, as further described herein. The vehicle 100 may use an internal combustion engine, an electric motor, or a hybrid propulsion system (e.g., a combination of an engine and an electric motor) for propulsion. In some cases, the vehicle 100 may have one or more electrical and/or electronic systems that comply with certain functional safety standards, such as ISO 26262 as provided by the International Organization for Standardization (ISO).

Figure 2:
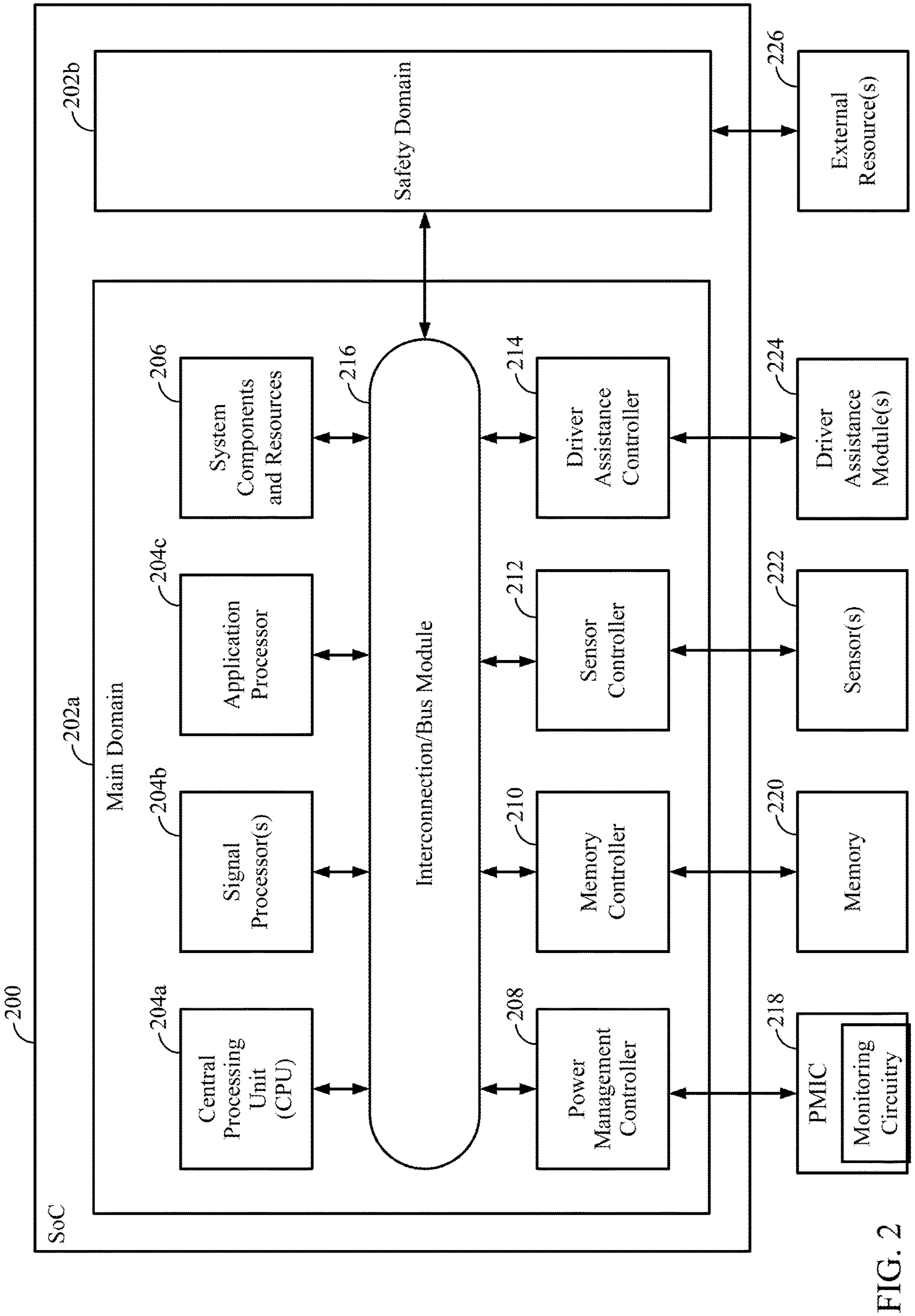
FIG. 2 is a block diagram of example components and interconnections in a system-on-a-chip (SoC), in which aspects of the present disclosure may be practiced.
Figure 3:
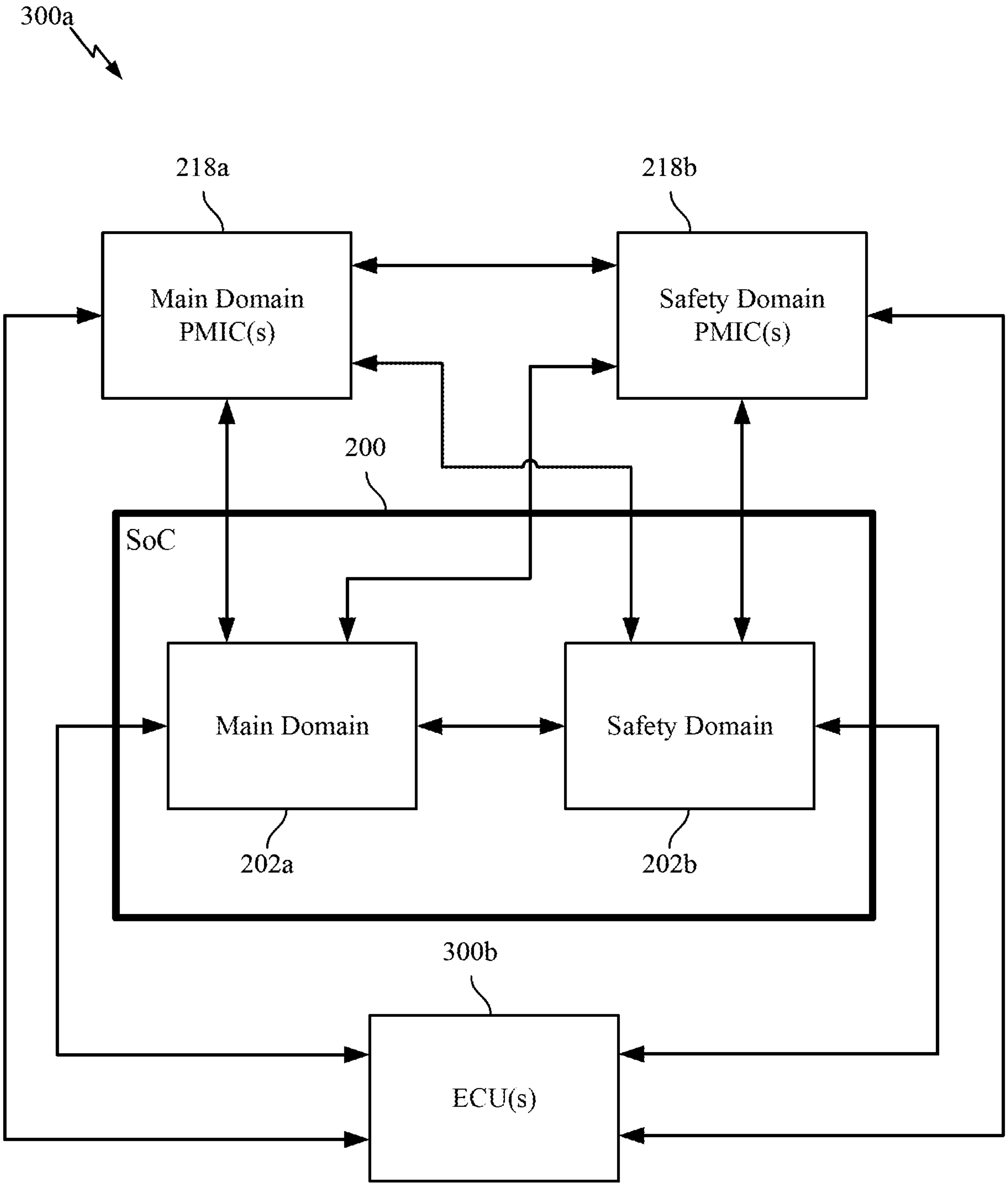
FIG. 3 is a block diagram of an example SoC-based electronic control unit (ECU) in communication with one or more other ECUs, in which aspects of the present disclosure may be practiced.

The vehicle 100 may include a vehicle control system 102, which may include one or more computing devices having system-on-a-chips (SoCs) (e.g., one or more electronic control units (ECUs)) as further described herein with respect to FIGS. 2 and 3. The vehicle control system 102 may be coupled to a variety of vehicle systems and subsystems, such as an environmental system 104 (e.g., an air conditioning and/or heating system), a navigation system 106, a communications and/or infotainment system 108, a power control system 110, a drivetrain control system 112, a driver assistance and/or automated driving control system

114, and/or a variety of sensors 116. Each vehicle system or subsystem may communicate with one or more other systems (and/or subsystem(s)) via one or more communication links, which may include wired communication links (e.g., a Controller Area Network (CAN) protocol compliant bus, Universal Serial Bus (USB) connection, Ethernet connection, universal asynchronous receiver-transmitter (UART), etc.) and/or wireless communication links (e.g., a Wi-Fi® link, Bluetooth® link, ZigBee® link, ANT+® link, etc.).

The vehicle control system 102 may perform certain operations associated with any of the vehicle systems and subsystems. For example, the vehicle control system 102 may control or initiate the power-on and/or shutdown sequence for any of the vehicle systems and subsystems. The vehicle control system 102 may monitor for errors associated with any of the vehicle systems and subsystems, and in some cases, the vehicle control system 102 may store the errors for vehicle diagnostics. In response to any errors detected, the vehicle control system 102 may perform certain actions, such as shutting down the affected system or transferring some of the affected operations to be performed at a different vehicle system. The vehicle control system 102 may monitor the power levels supplied to any of the vehicle systems and subsystems and ensure that the power levels supplied satisfy the operating specifications for any of the vehicle systems and subsystems.

The environmental system 104 may control the cooling and/or heating systems associated with the vehicle 100. For example, the vehicle 100 may have an air conditioning system, a heating system, heated or cooled seat(s), and/or a heated steering wheel, and the environmental system 104 may adjust the temperature according to user (or default) settings for the respective cooling and/or heating components. The navigation system 106 may show the vehicle's location on a map and provide navigation information, such as directions to a destination, via a display and/or a speaker (neither shown).

The communications and/or infotainment system 108 may allow the user to access various information (e.g., navigation information, interior or exterior environmental information, ADAS information, etc.), applications, and/or entertainment or media content, such as music and/or videos. The communications and/or infotainment system 108 may allow the user to update or access settings associated with a variety of systems, such as the environmental system 104, the navigation system 106, ADAS, vehicle settings, etc. The communications and/or infotainment system 108 may allow the user and/or vehicle 100 to wirelessly communicate via an integrated modem of the vehicle or via the user's wireless communication device (e.g., a smartphone or tablet).

The power control system 110 may control the components that output power to move the vehicle, such as an internal combustion engine (e.g., adjusting the air-fuel ratio, boost pressure, valve timing, etc.), an electric power system (e.g., controlling regenerative braking, battery power output, battery charging, battery cooling, etc.), and/or a hybrid power system (e.g., controlling regenerative braking, switching between battery power and engine power, battery charging, battery cooling, etc.). The drivetrain control system 112 may control the various components of the vehicle 100 that deliver power to the drive wheels. For example, the drivetrain control system 112 may control gear shifting in an automatic transmission. For a four-wheel drive vehicle, the drivetrain control system 112 may control the power ratio applied to the front and rear drive wheels.

The driver assistance and/or automated driving control system 114 may control various driver assistance features and functions, such as adaptive cruise control, automated lane detection, lane departure warning, automated steering, automated braking, and automated collision avoidance. The driver assistance and/or automated driving control system 114 may control automated driving at various levels of automation, such as any of the Society of Automotive Engineers (SAE) levels 1 through 5.

The variety of sensors 116 coupled to the vehicle control system 102 may include a speedometer, a wheel speed sensor, a torquemeter, a turbine speed sensor, a variable reluctance sensor, a sonar system, a radar system, an air-fuel ratio meter, a water-in-fuel sensor, an oxygen sensor, a crankshaft position sensor, a curb feeler, a temperature sensor, a Hall effect sensor, a manifold absolute pressure sensor, various fluid sensors (e.g., engine coolant sensor, transmission fluid sensor, etc.), a tire-pressure monitoring sensor, a mass airflow sensor, a speed sensor, a blind spot monitoring sensor, a parking sensor, cameras, microphones, accelerometers, compasses, a global navigation satellite system (GNSS) receiver (e.g., a global positioning system (GPS) receiver or a Galileo receiver), and other similar sensors for monitoring physical or environmental conditions in and around the vehicle.

The aforementioned systems are presented merely as examples, and vehicles may include one or more additional systems that are not illustrated for clarity. Additional systems may include systems related to additional other functions of the vehicular system, including instrumentation, airbags, cruise control, other engine systems, stability control parking systems, tire pressure monitoring, antilock braking, active suspension, battery level and/or management, and a variety of other systems.

Example System-On-A-Chip

As used herein, the term "system-on-a-chip" (SoC) generally refers to an integrated electronic device comprising one or more integrated circuit (IC) dies (e.g., chiplets), which combines multiple electronic components (e.g., processors and/or memory) on a single substrate or in a single package. A single SoC may contain circuitry for digital, analog, mixed-signal, and/or radio-frequency functions. A single SoC may also include any number of general purpose and/or specialized processors (digital signal processors, modem processors, video processors, etc.), memory blocks (e.g., ROM, RAM, DRAM, flash, etc.), and resources (e.g., timers, voltage regulators, oscillators, etc.). A SoC may also include software for controlling the integrated resources and processors, as well as for controlling peripheral devices.

FIG. 2 is a block diagram of example components and interconnections in a SoC 200 suitable for implementing various aspects of the present disclosure. The SoC 200 may include multiple processing domains having, for example, at least one main domain **202*a* and at least one safety domain 202*b* (also referred to as a "safety island (SAIL)"). In the case of multiple main (or safety) domains, the main (or safety) domains may be similar to one another. For ease of description and illustration, the remainder of the disclosure may refer to a main domain 202*a* and a safety domain 202*b***, but the reader is to understand that there may be more than one main domain and/or more than one safety domain.

The main domain **202*a* may be configured to support (or be capable of performing) vehicle operations (e.g., driver assistance and/or automated driving operations, features, etc.) up to a specific automotive safety integrity level (ASIL), and the safety domain 202*b* may be configured to support (or be capable of performing) vehicle operations up to a lower, the same, or a higher ASIL than the main domain 202***a*. For example, the main domain 202*a* may be configured to support (or be capable of performing) vehicle operations up to an ASIL B, and the safety domain 202*b* may be configured to support vehicle operations up to an ASIL D. In some cases, the main domain 202*a* may be configured to support (or be capable of performing) vehicle operations up to an ASIL A, B, C, or D, and the safety domain 202*b* may be configured to support vehicle operations up to a different ASIL than the main domain 202*a*. In certain cases, the main domain 202*a* and the safety domain 202*b* may be configured to support (or be capable of performing) vehicle operations at the same ASIL (e.g., ASIL D). The main domain 202*a* and the safety domain 202*b* may be configured to support (or be capable of performing) vehicle operations at different ASILs.

The ASILs may be defined in a specific safety standard, such as ISO 26262. For example, the ASILs may provide a risk classification scheme for certain electrical and electronic systems of road vehicles. ISO 26262 provides four ASILs including ASIL A, ASIL B, ASIL C, and ASIL D. ASIL D is the highest classification and corresponds to the highest level of safety measures for avoiding an unreasonable residual risk, and ASIL A is the lowest classification and corresponds to the lowest level of safety measures.

In certain aspects, the SoC 200 may be included in a computing device (e.g., an ECU) in a vehicle control system. The SoC 200 may control any of the systems described herein with respect FIG. 1. For example, the SoC 200 may be configured to control an ADAS/AD system, such as the driver assistance and/or automated driving control system 114 described herein with respect to FIG. 1. In certain aspects, the SoC 200 may be in communication with other ECU(s) in a vehicle control system, and the SoC 200 and/or a PMIC 218 may report errors associated with the SoC 200 to the other ECU(s), as further described herein with respect to FIG. 3. For example, the main domain 202*a* may control the environmental system, the infotainment system, and driver assistance features up to a certain ASIL, and the safety domain 202*b* may control driver assistance features up to a certain ASIL, which may typically be higher than the main domain 202*a*.

The main domain 202*a* and/or safety domain 202*b* may include a number of heterogeneous processors 204*a-c* (collectively referred to herein as "processors 204"), such as a central processing unit (CPU) 204*a*, signal processor(s) 204*b* (e.g., a digital signal processor, an image signal processor, a neural network signal processor, etc.), and/or an application processor 204*c*. Each processor 204 may include one or more cores, and each processor/core may perform operations independent of the other processors/cores. Each processor 204 may be part of a subsystem (not shown) including one or more processors, caches, etc. configured to handle certain types of tasks or computations. It should be noted that the main domain 202*a* and/or safety domain 202*b* may include additional processors (not shown) or may include fewer processors (not shown). The main domain 202*a* and/or safety domain 202*b* may include other processors (e.g., a graphics processing unit (GPU), a vision processing unit, etc.) in addition to or instead of those illustrated.

The main domain 202*a* and/or safety domain 202*b* may include system components and resources 206 for performing certain specialized operations, such as analog-to-digital conversions and/or wireless data transmissions. The system components and resources 206 may include components such as voltage regulators, oscillators, phase-locked loops (PLLs), modems, peripheral bridges, data controllers, system controllers, access ports, timers, and other similar components used to support the processors and software clients running on the SoC 200. The system components and resources 206 may include circuitry for interfacing with peripheral devices, such as cameras, electronic displays, wireless communication devices, external memory chips, etc.

The main domain 202*a* and/or safety domain 202*b* may further include a power management controller 208, a memory controller 210 (e.g., a dynamic random access memory (DRAM) memory controller and/or a non-volatile memory controller), a sensor controller 212, and/or a driver assistance controller 214. The main domain 202*a* and/or safety domain 202*b* may also include an input/output (IO) module (not shown) for communicating with resources external to the SoC, such as a clock and a voltage regulator, each of which may be shared by two or more of the internal SoC components. The IO module may include a general purpose IO (GPIO) interface, for example. In certain aspects, each of the main domain 202*a* and the safety domain 202*b* may have a separate clock and power supply to facilitate independent operability.

The processors 204 of the main domain 202*a* may be interconnected to the system components and resources 206, the power management controller 208, the memory controller 210, the sensor controller 212, the driver assistance controller 214, other system components, and/or the safety domain 202*b* via an interconnection/bus module 216, which may include an array of reconfigurable logic gates and/or implement a bus architecture (e.g., CoreConnect, advanced microcontroller bus architecture (AMBA), etc.). Communications may be provided by advanced interconnects, such as high performance networks-on-chip (NoCs).

The interconnection/bus module 216 may include or provide a bus mastering system configured to grant SoC components (e.g., processors, peripherals, etc.) exclusive control of the bus (e.g., to transfer data) for a set duration, number of operations, number of bytes, etc. In certain aspects, the interconnection/bus module 216 may include a direct memory access (DMA) controller (not shown) that enables components connected to the interconnection/bus module 216 to operate as a master component and initiate memory transactions. The interconnection/bus module 216 may implement an arbitration scheme to prevent multiple master components from attempting to drive the bus simultaneously.

The power management controller 208 may manage the power supplied to the main domain 202*a* from a PMIC 218, which may be representative of one or more PMIC(s). In some cases, the power management controller 208 may report errors associated with the main domain 202*a* and/or safety domain 202*b* to the PMIC 218, as further described herein. The power management and error monitoring control may be separate and independent between the main domain 202*a* and the safety domain 202*b*.

The memory controller 210 may be a specialized hardware module configured to manage the flow of data to and from a memory 220. The memory controller 210 may include logic for interfacing with the memory 220, such as selecting a row and column in a cell array of the memory 220 corresponding to a memory location, reading or writing data to the memory location, etc. The memory 220 may be an on-chip component (e.g., on the substrate, die, integrated chip, etc.) of the SoC 200, or alternatively (as shown) an off-chip component.

The sensor controller 212 may manage the sensor data received from various sensors 222, such as the sensors 116. The sensor controller 212 may include circuitry for interfacing with the sensors 222. For example, the sensor controller 212 may receive sensor data from a tire pressure monitoring system and/or a radar sensor used for adaptive cruise control.

The driver assistance controller 214 may control certain driver assistance functions via a driver assistance module 224 (e.g., one or more actuators, relays, switches, etc.). For example, the driver assistance controller 214 may control the adaptive cruise control by controlling actuators coupled to the engine and/or braking system. In some cases, the driver assistance controller 214 may perform automated steering by controlling actuators attached to the steering system. It will be appreciated that the driver assistance controller 214 is merely an example, and the main domain 202*a* and/or the safety domain 202*b* may include a controller that interfaces with automated driving components in addition to or instead of the driver assistance controller 214.

The SoC 200 may also include additional hardware and/or software components that are suitable for collecting sensor data from sensors, including speakers, user interface elements (e.g., input buttons, touch screen display, etc.), microphone arrays, sensors for monitoring physical conditions (e.g., location, direction, motion, orientation, vibration, pressure, temperature, etc.), cameras, compasses, GPS receivers, communications circuitry (e.g., Bluetooth®, wireless local area network (WLAN), Long Term Evolution (LTE), Fifth Generation New Radio (5G NR), etc.), and other well-known components (e.g., accelerometer, etc.) of modern electronic devices.

Each of the processing domains may operate independently of the other domains. In some cases, each of the processing domains may be coupled to separate and independent external resources, such as a PMIC, memory, sensor (s), and driver assistance module(s). A particular external resource may be designed in accordance with an ASIL corresponding to the particular ASIL associated with the main domain 202*a* and/or the safety domain 202*b* to which the external resource is coupled. For example, the PMIC 218 may have the same ASIL as the main domain 202*a*, and the PMIC that provides power to the safety domain 202*b* may have the same ASIL as the safety domain 202*b*. The safety domain 202*b* may include the same or different processing resources and components as the main domain 202*a* as described herein with respect to the main domain 202*a*. For example, the safety domain 202*b* may include the processors 204, the system components and resources 206, the power management controller 208, the memory controller 210, the sensor controller 212, and the driver assistance controller 214. The safety domain 202*b* may be coupled to certain external resource(s) 226, which may be representative of a PMIC, memory, sensors, and/or driver assistance module, for example, as described herein with respect to the main domain 202*a*.

In addition to the SoC 200 discussed above, various aspects may be implemented in a wide variety of computing systems, which may include a single processor, multiple processors, multicore processors, or any combination thereof. Various aspects described herein may also be implemented in systems that employ more than one SoC. For example, a SoC-based ECU may include multiple SoCs (e.g., SoCs 200) configured to monitor the safety of a vehicle control system (e.g., vehicle control system 102). In these examples, each of the multiple SoC(s) may include different numbers of main domains and/or safety domains.

FIG. 3 is a block diagram of an example SoC-based ECU 300*a* in communication with one or more other ECUs 300*b*, for example, for safety monitoring. In this example, the ECU 300*a* and the other ECU(s) 300*b* may operate in a vehicle control system and/or any vehicle system or subsystem, as described herein with respect to FIG. 1. The ECU 300*a* may perform some vehicle control operations (e.g., infotainment, environmental, ADAS, etc.), and the other ECU(s) 300*b* may perform some vehicle control operations (e.g., system wide controls, engine controls, drivetrain controls, other ADAS features, etc.). As an example, the ECU 300*a* may be an ADAS ECU. The ECU 300*a* may include the SoC 200 and corresponding external resources as described herein with respect to FIG. 2. In some aspects, the other ECU(s) 300*b* may include a SoC-based ECU, such as the SoC 200 and corresponding external resources as described herein with respect to FIG. 2.

The main domain 202*a* may operate independently of the safety domain 202*b* with independent external resources. For example, the main domain 202*a* may receive power from main domain PMIC(s) 218*a*, and the safety domain 202*b* may receive power from safety domain PMIC(s) 218*b*, which are different from the main domain PMIC(s) 218*a* and may provide independent power. Such a power architecture may allow the main domain 202*a* to operate even while the safety domain 202*b* is shut down or in a low power state, or vice versa. In some cases, the safety domain 202*b* may be operational to monitor the main domain 202*a* for errors.

Any of the main domain 202*a*, the safety domain 202*b*, the main domain PMIC(s) 218*a*, and/or the safety domain PMIC(s) 218*b* may perform self-error detection, where the component may detect an error that occurs at the component. For example, the main domain 202*a* may detect an error that occurs at the main domain 202*a*. These components may also perform redundant error detection as further described herein, where the component may detect an error that occurs at another component. For example, the safety domain 202*b* may detect an error that occurs at the main domain 202*a*, or vice versa. The safety domain 202*b* may monitor a safety subsystem of the main domain 202*a* for errors. The ECU 300*a* may use a redundant error propagation scheme, where any errors detected within safety subsystems are routed to the main domain 202*a* and the safety domain 202*b*. For example, the safety domain PMIC(s) 218*b* may notify the main domain 202*a* of the occurrence of an error associated with the safety domain 202*b* or the occurrence of an error within the safety domain PMIC(s) 218*b*.

Aspects Of Adaptive Clock Duty Cycle Controller (DCC) Safety-Critical Features for Automotive SoCs Aspects of the present disclosure relate to duty cycle management in a clock distribution network.

Figure 4:
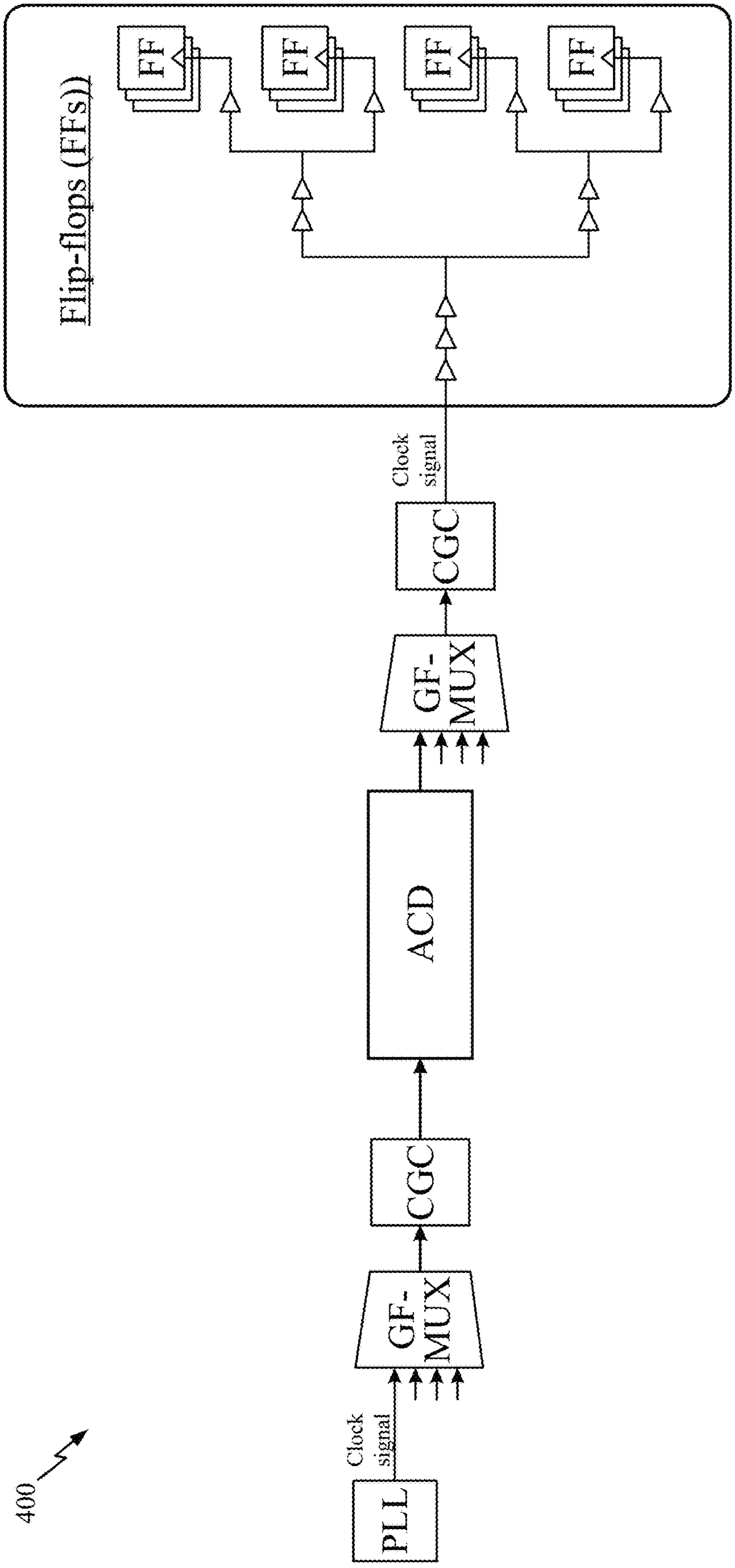
FIG. 4 illustrates example components in a path of a clock signal from a clock generator (e.g., a phase-locked loop (PLL)) to circuits (e.g., including flip-flops).

FIG. 4 illustrates a diagram 400 showing example components in a path of a clock signal from a clock generator (e.g., a phase-locked loop (PLL)) to circuits (e.g., in automotive systems-on-chips (SoCs)). The circuits may include flip-flops, which may be clocked by the clock signal. The circuits are not limited to the flip-flops and may include other devices in addition to or instead of the flip-flops.

The clock generator may be configured to generate the clock signal for timing operations of the circuits. The clock generator may be implemented with the PLL or another type of clock generator.

The clock signal may be a periodic signal that oscillates between a high and a low. The clock signal may be used to time operations of the circuits such as synchronous digital circuits or other types of circuits. The clock signal may have a duty cycle, which may be expressed as a percentage or a fraction of a clock period (i.e., a clock cycle) in which the clock signal is high (i.e., one). The clock signal may be gated to save power (e.g., when the circuits are not active). Clock gating may be a technique for reducing dynamic power consumption when one or more circuits are not active.

A clock distribution network may be configured to distribute the clock signal from the clock generator to the circuits. The clock generator may be coupled to an input of the clock distribution network. Each of the circuits may be coupled to one or more outputs of the clock distribution network. The clock distribution network may receive the clock signal from the clock generator via the input (also referred to as a root node) of the clock distribution network and distributes the clock signal to the circuits via the outputs (also referred to as leaf nodes) of the clock distribution network.

The clock distribution network may include a signal path (or a clock path). The signal path may be a path through which a signal (e.g., the clock signal) propagates, and may include one or more components such as one or more splitters, one or more inverters, one or more amplifiers, one or more switches, one or more voltage-level shifters, one or more glitch free (GF) multiplexers (MUX), and/or one or more delay buffers.

The clock distribution network may also include an adaptive clock distribution (ACD) system to mitigate any impact of supply voltage droop. For example, a stable, regulated supply voltage (Vdd) is desirable in electronic circuits such as integrated circuits for processing systems, SoCs, etc. Abrupt changes in switching activity of the electronic circuits, for example, may cause a droop in supply voltage (referred to herein as, the voltage droop), inducing large current transients in voltage or power-delivery systems for the electronic circuits. The voltage droop may have a global effect across all electronic circuits integrated on a semiconductor die and may be random and unpredictable in their occurrence. The voltage droop may degrade the performance and energy efficiency of the electronic circuits, a problem which may be exacerbated in high-frequency or high performance designs. In the event of the voltage droop, the ACD system may utilize a clock-data delay compensation technique to provide an acceptable response time during which a clock frequency may be adaptively reduced without affecting the performance of the electronic circuit.

The clock distribution network may also include one or more clock gating circuits (CGCs) (also referred to as clock gating cells) to gate the clock signal when the circuits are idle in order to reduce dynamic power consumption. In one example, the one or more CGCs may be coupled between the clock generator and an input of the signal path. The one or more CGCs may be configured to pass the clock signal in an active mode of the circuits and to gate the clock signal (i.e., block the clock signal) in an idle mode of the circuits to conserve power in the idle mode of the circuits.

One challenge with the clock distribution network is that PLL duty cycle variations, systematic design limitations of the components in the clock distribution network, random hardware faults associated with the components in the clock distribution network, and/or aging of the components in the clock distribution network, may cause duty cycle distortion (DCD) of the duty cycle of the clock signal at the leaf nodes (e.g., the outputs of the clock distribution network), which are coupled to the circuits. For example, the DCD may accumulate across the signal path due to the aging of the components in the clock distribution network when the signal path may not toggle for extended periods of time. Also, internet of things (IoT) devices, automotive processors and/or other processors/servers (e.g., which may be used in applications where the processors/servers may be exposed to severe environmental stress conditions and are expected to operate reliably for very long periods of time) may exacerbate aging-induced DCD of the duty cycle of the clock signal. The DCD of the duty cycle of the clock signal may lead to timing issues (e.g., timing violations) in the circuits if not corrected. The DCD of the duty cycle of the clock signal may also degrade a minimum voltage ($V_{MIN}$) of the automotive processors.

Figure 5:
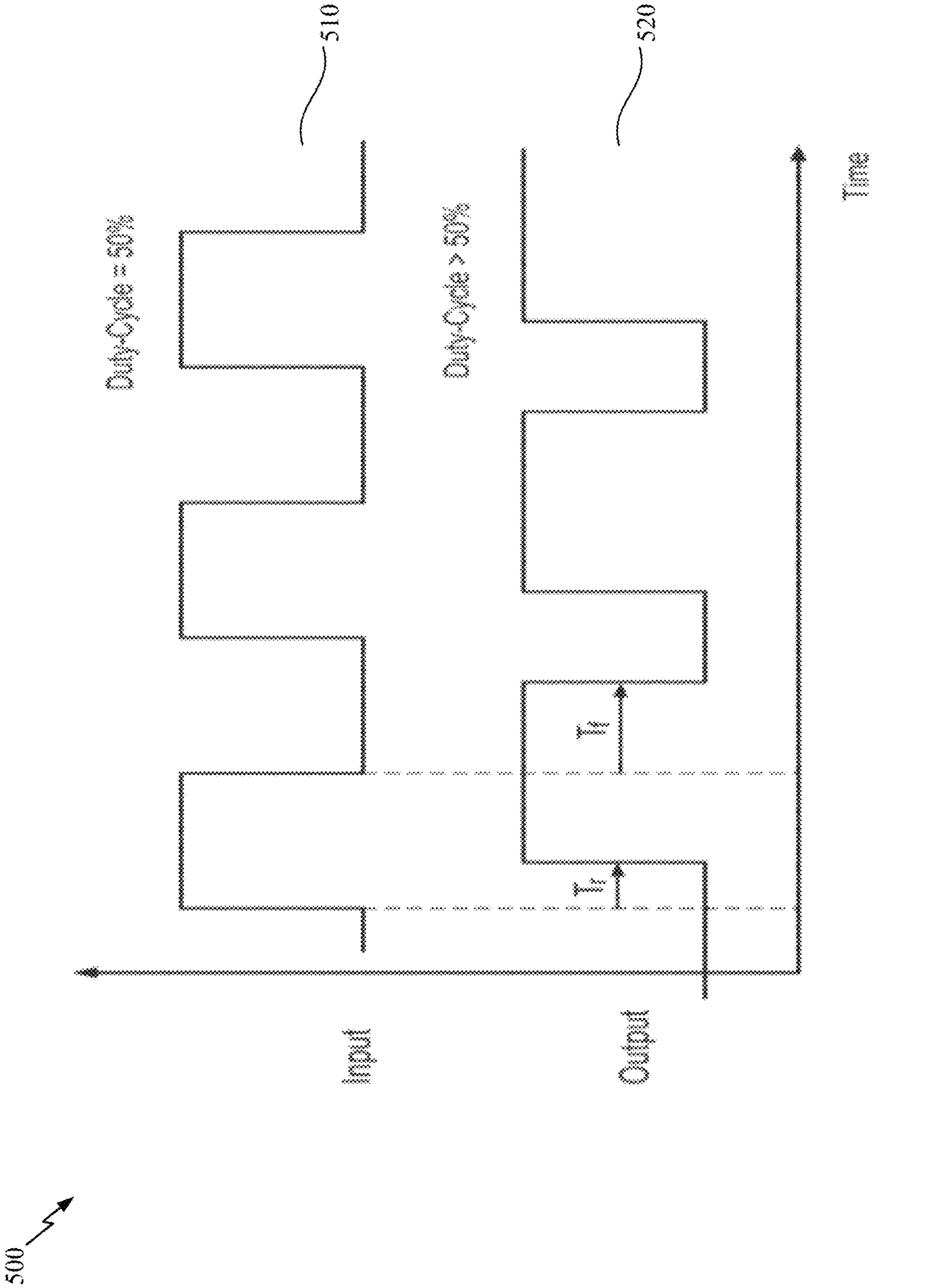
FIG. 5 illustrates an example of a duty cycle distortion (DCD) in a clock signal path due to aging.

An example of the DCD of the duty cycle of the clock signal due to aging in the signal path of the clock distribution network will now be discussed with reference to FIG. 5. As shown in a diagram 500 of FIG. 5, a clock signal 510 may be an input to the signal path of the clock distribution network when the signal path is not in an idle mode (i.e., the signal path is active). In this example, the clock signal 510 at the input of the signal path has a 50% duty cycle. FIG. 5 also shows a clock signal 520 at an output of the signal path of the clock distribution network after the clock signal 520 has propagated through the signal path of the clock distribution network. The signal path of the clock distribution network delays a rising edge of the clock signal 520 (e.g., with respect to the clock signal 510) by a delay $T_r$ and delays a falling edge of the clock signal 520 (e.g., with respect to the clock signal 510) by a delay $T_r$. As shown in FIG. 5, the delay $T_f$ of the falling edge is longer than the delay $T_r$ of the rising edge, which may be due to the asymmetric aging (e.g., of transistors of the delay buffers and other components) in the signal path of the clock distribution network. The longer delay of the falling edge of the clock signal 520 may cause the duty cycle of the clock signal 520 at the output of the signal path to increase (i.e., results in a duty cycle greater than 50%). So, in this example, the DCD due to the aging increases the duty cycle of the clock signal 520.

The asymmetric aging may also occur for a case where the input of the signal path of the clock distribution network may be held high in the idle mode. In this case, the asymmetric aging may cause a rising edge delay of the signal path of the clock distribution network to increase relative to a falling edge delay of the signal path of the clock distribution network, resulting in the DCD that decreases the duty cycle of the clock signal. So, the asymmetric aging of the transistors in the signal path of the clock distribution network causes the DCD over time. The DCD may either increase or decrease the duty cycle of the clock signal depending on, for example, whether the input of the signal path of the clock distribution network is held low or high in the idle mode, a number of components in the signal path, and/or other factors.

Aspects of the present disclosure relate to an adaptive clock duty cycle controller (DCC) in an automotive SoC. The adaptive clock DCC may include one or more devices, which may be configured to measure and adapt a duty cycle of a clock signal to compensate for aging effects on components in a signal path of a clock distribution network. The adaptive clock DCC may mitigate the DCD from aging and other effects such as a PLL DCD or an intrinsic clock-distribution DCD.

To deploy the adaptive clock DCC into the automotive SoC, the adaptive clock DCC may be designed and configured to satisfy various automotive-safety-compliance requirements. For example, one or more safety-critical features implemented for deploying the adaptive clock DCC into the automotive SoC may include an end-to-end system self-checking test with two duty cycle adjusters (DCAs) circuits to enable in-field verification to detect hardware errors; a programmable safety feature to limit a magnitude of DCA duty cycle correction at a root node; a duty cycle monitor (DCM), a DCA, and adaptive control finite-state machines (FSMs) being implemented with a hamming code-based FSM-state encoding to detect invalid state transitions; DCC configuration registers implemented with a two-dimensional (2D) parity protection; and a clock-monitoring circuit downstream of the DCC to detect any hardware faults.

Figure 6:
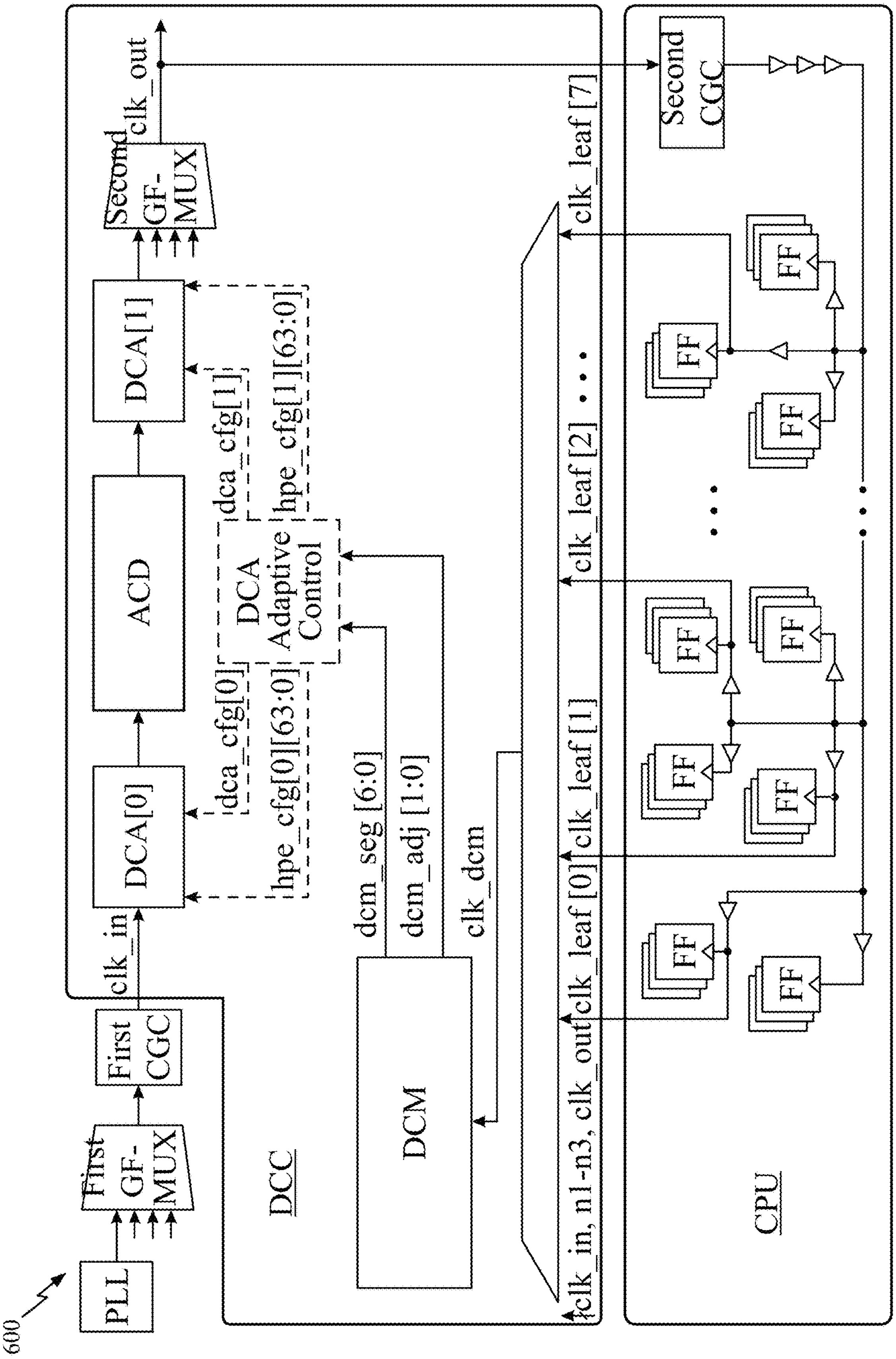
FIG. 6 illustrates example adaptive clock duty cycle controller (DCC) and other devices, in which aspects of the present disclosure may be practiced.
Figure 7:
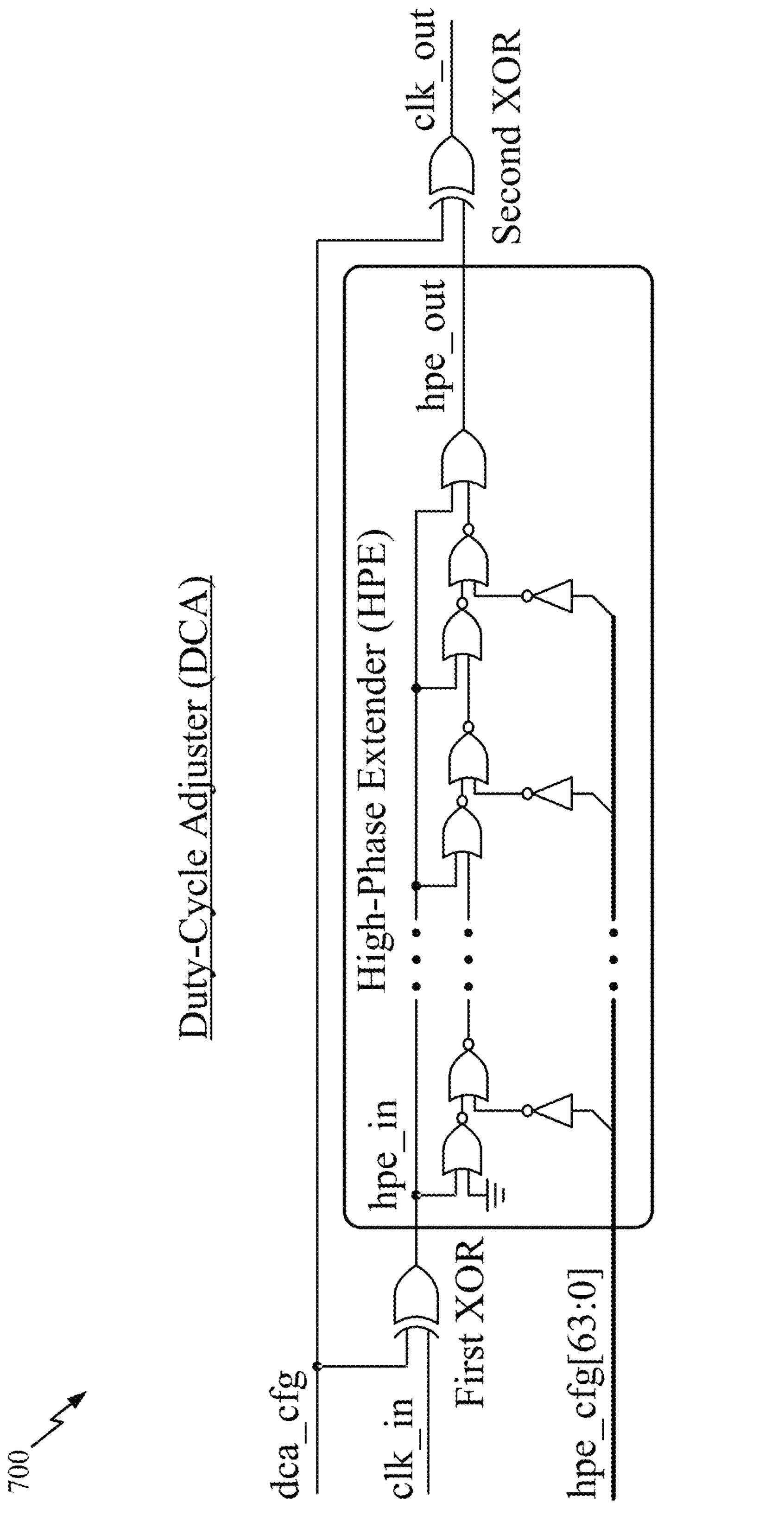
FIG. 7 illustrates an example duty cycle adjuster (DCA), in which aspects of the present disclosure may be practiced.
Figure 8:
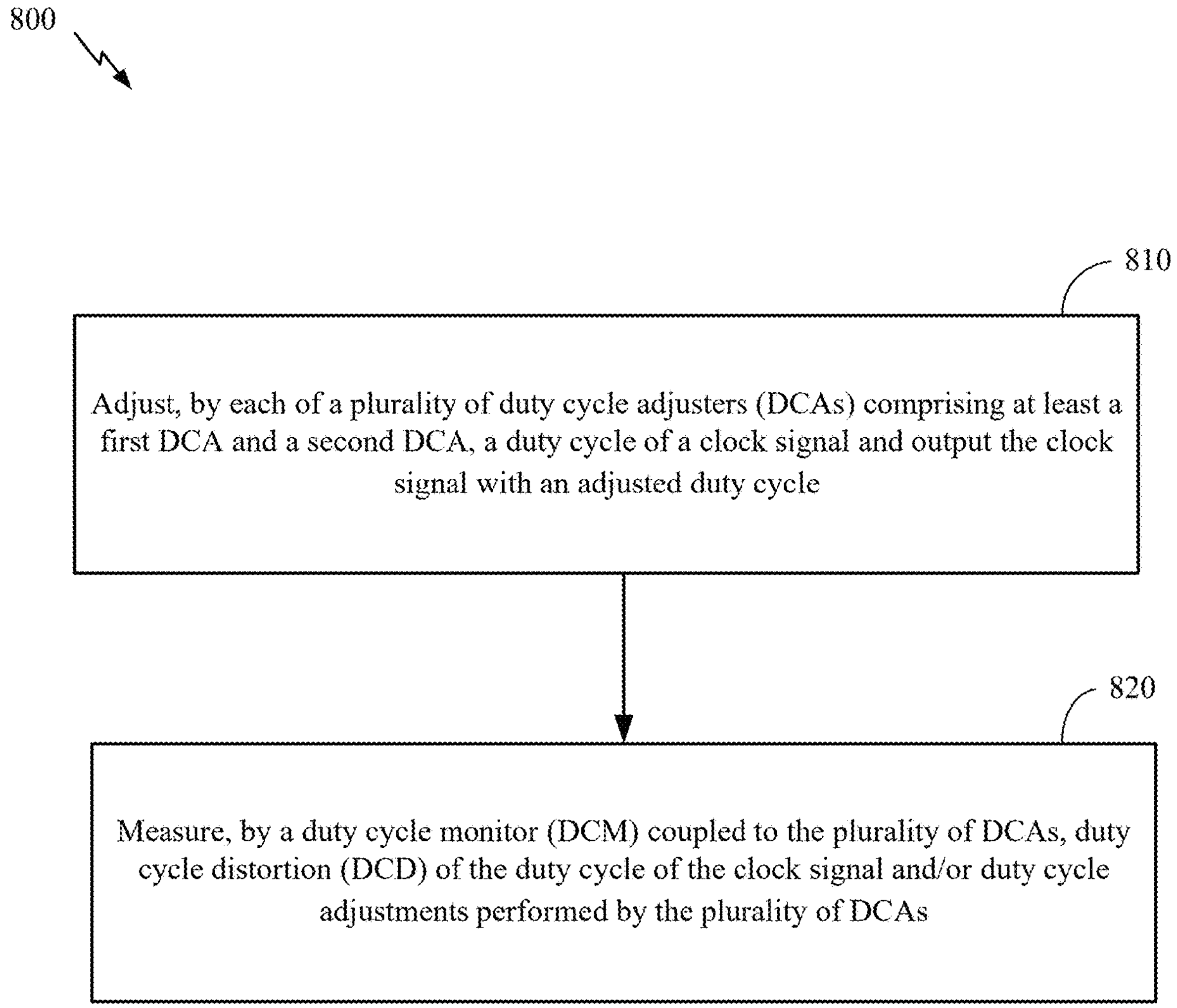
FIG. 8 depicts an example method for a self-checking test, in accordance with certain aspects of the present disclosure.

Techniques proposed herein for duty cycle management in the clock distribution network may be further understood with reference to FIG. 6-FIG. 8.

FIG. 6 is a diagram 600 of example adaptive clock DCC and other devices configured for duty cycle management in a clock distribution network. In one aspect, the DCC may be included in a SoC in the vehicle 100 of FIG. 1. In another aspect, the DCC may perform some functions of the vehicle control system 102 of the vehicle 100 described in FIG. 1. In another aspect, the DCC may correspond to or is associated with the SoC-based ECU 300*a* in FIG. 3. In another aspect, the DCC may be part of a subsystem in the main domain 202*a* of the SoC 200 of FIG. 2. In another aspect, the DCC may be part of a subsystem in the safety domain 202*b* of the SoC 200 of FIG. 2. In another aspect, the DCC may be part of a clock distribution network of a central processing unit (CPU). In another aspect, the DCC may be part of a clock distribution network of a graphics processing unit (GPU). In another aspect, the DCC may be part of a clock distribution network of a neural processing unit (NPU). The CPU, the GPU, and/or the NPU may be the part of any device (e.g., which may or may not be included in the vehicle control system 102 of FIG. 1).

The diagram 600 may include a clock generator (e.g., a PLL), a first GF-MUX, multiple CGCs (e.g., a first CGC and a second CGC), circuits (e.g., flip-flops), and the DCC that are coupled (e.g., directly or indirectly coupled) to each other. The clock generator may generate a clock signal for timing operations of the circuits. The clock distribution network may distribute the clock signal from the clock generator to the circuits. The clock distribution network may include a signal or clock path through which the clock signal propagates. The clock distribution network may include the first GF-MUX, the multiple CGCs, and/or the DCC.

The DCC may include (or may manage operations of) a first DCA (e.g., depicted as DCA [0]), a second DCA (e.g., depicted as DCA [1]), a DCM, a DCA adaptive controller, an ACD system, and a second GF-MUX that are coupled (e.g., directly or indirectly coupled) to each other. For example, the first DCA may be coupled to the DCM via the DCA adaptive controller. The DCM may be coupled to the first DCA through the clock path between the first DCA and the DCM. The second DCA may be coupled to the DCM via the DCA adaptive controller. The second DCA may be before the first DCA or after the first DCA in the clock path. Each DCA may adjust a duty cycle of the clock signal and output the clock signal with an adjusted duty cycle. The DCM may measure DCD of the duty cycle of the clock signal in the clock distribution network and/or measure duty cycle adjustments performed by the DCAs.

The DCC may perform a test sequence at every power-on cycle. In this test sequence, the first DCA may perform distortion of the duty cycle of the clock signal and output the clock signal with a distorted duty cycle. That is, the first DCA may induce the DCD of the duty cycle of the clock signal to represent an aging effect of the devices in the clock distribution network.

For example, the first DCA may have a signal input, a control input, and an output. The signal input of the first DCA is coupled to the first CGC and the output of the first DCA is coupled to the ACD system. The first DCA is configured to receive the clock signal (e.g., from the PLL) at the signal input of the first DCA (e.g., via the first GF-MUX and the first CGC), distort (or adjust) the duty cycle of the clock signal (i.e., perform the DCD or a duty cycle adjustment of the clock signal), and output the clock signal after the duty cycle adjustment (i.e., the clock signal with the distorted duty cycle) at the output of the first DCA. The clock signal at the output of the first DCA may also be referred to as the duty cycle distorted clock signal since the first DCA distorts the duty cycle of the clock signal received at the input of the first DCA to generate the duty cycle distorted clock signal at the output of the first DCA. In some cases, the first DCA may distort the duty cycle of the clock signal based on a control signal received at the control input of the first DCA from the DCA adaptive controller. Since the output of the first DCA is coupled to the ACD system, the first DCA may provide the clock signal with the distorted duty cycle at the ACD system.

The DCM measures the first DCA induced DCD of the duty cycle of the clock signal. For example, the DCM may determine the DCD based on measuring one or more parameters of the distorted duty cycle of the clock signal and output DCD measurements of the distorted duty cycle of the clock signal to the DCA adaptive controller. The one or more parameters may include a high phase of the clock signal, a low phase of the clock signal, and a period of the clock signal.

For example, the DCM may have an input and an output. The input of the DCM is coupled to a leaf node of the clock distribution network. The DCM is configured to receive the clock signal at the input, measure the one or more parameters of the clock signal, and output a measurement signal based on the one or more measured parameters to the DCA adaptive controller. The measurement signal may indicate the DCD measurements of the distorted duty cycle of the clock signal. The one or more parameters provide information related to the distorted duty cycle of the clock signal received at the DCM. For example, the one or more parameters may include a measurement of a high phase of the clock signal, in which the high phase is a duration that the clock signal is high (i.e., one) during one clock period (i.e., one period of the clock signal). In this example, for a given clock period, a larger high phase is indicative of a larger duty cycle and a smaller high phase is indicative of a smaller duty cycle. The one or more parameters may also include a measurement of a low phase of the clock signal, in which the low phase is a duration that the clock signal is low (i.e., zero) during one clock period. In this example, for a given clock period, a larger low phase is indicative of a smaller duty cycle and a smaller low phase is indicative of a larger duty cycle. The DCM receives and measures the clock signal after the clock signal has undergone the DCD at the first DCA and in the clock distribution network. As a result, the measurement signal from the DCM to the DCA adaptive controller provides information on the DCD of the clock signal.

The DCA adaptive controller may determine a duty cycle correction value to correct the distorted duty cycle of the clock signal, based on the DCD measurements of the distorted duty cycle of the clock signal received from the DCM.

The DCA adaptive controller may transmit the duty cycle correction value to the second DCA.

For example, the DCA adaptive controller may have an input and an output. The input of the DCA adaptive controller is coupled to the output of the DCM and the output of the DCA adaptive controller is coupled to control inputs of the first DCA and the second DCA. The DCA adaptive controller may receive the measurement signal (e.g., indicating the DCD measurements of the distorted duty cycle of the clock signal) from the DCM, and then determine and transmit the duty cycle correction value to correct the distorted duty cycle of the clock signal to the second DCA via the control input of the second DCA.

The DCA adaptive controller may compensate for the DCD by determining the duty cycle correction value (e.g., based on the measurement signal from the DCM) that can be used to correct the distorted duty cycle of the clock signal and then setting a duty cycle adjustment of the distorted duty cycle of the clock signal at the second DCA based on the duty cycle correction value. For example, the measurement signal from the DCM may indicate the high phase of the clock signal measured at the leaf node. In this example, the DCA adaptive controller may compare the measured high phase with a target high phase corresponding to a target duty cycle to determine the duty cycle correction value. For an example in which the target duty cycle is a 50% duty cycle, the target high phase is approximately equal to half a clock period. If the measured high phase is greater than the target high phase (e.g., which occurs when the duty cycle of the clock signal at the leaf node is greater than the target duty cycle), then the DCA adaptive controller may determine the duty cycle correction value for the second DCA that decreases the duty cycle of the clock signal at the leaf node. In this case, the decrease in the duty cycle reduces the difference between the duty cycle of the clock signal at the leaf node and the target duty cycle. If, on the other hand, the measured high phase is less than the target high phase (e.g., which occurs when the duty cycle of the clock signal at the leaf node is less than the target duty cycle), then the DCA adaptive controller may determine the duty cycle correction value for the second DCA that increases the duty cycle of the clock signal at the leaf node.

The second DCA may correct the distorted duty cycle of the clock signal. For example, the second DCA may receive the distorted duty cycle of the clock signal from the first DCA via the ACD system. The second DCA may also receive the duty cycle correction value from the DCA adaptive controller. The second DCA may adjust the distorted duty cycle of the clock signal to a corrected duty cycle of the clock signal based on the duty cycle correction value. Once the duty cycle of the clock signal has been corrected by the second DCA, the DCM may obtain information associated with the corrected duty cycle of the clock signal. The DCM may then measure the corrected duty cycle of the clock signal and determine that the corrected duty cycle of the clock signal is same as an expected duty cycle of the clock signal.

In certain aspects, the first DCA and the second DCA may be configured to limit the adjustment of the duty cycle of the clock signal based on a threshold duty cycle correction value. For example, the first DCA and the second DCA may integrate a programmable safety feature, which may limit a magnitude of DCA-based duty cycle adjustment or correction. Post-silicon characterization of the first DCA and the second DCA may identify a specific DCA-based duty cycle adjustment or correction limit.

In certain aspects, the first DCA may be implemented with a hamming code-based finite state machine (FSM) state encoding to detect invalid state transitions. In some cases, the first DCA (e.g., implemented with the hamming code-based FSM state encoding) may also detect valid (but incorrect) state transitions.

In certain aspects, the second DCA may be implemented with the hamming code-based FSM state encoding to detect the invalid state transitions.

In certain aspects, the DCM may be implemented with the hamming code-based FSM state encoding to detect the invalid state transitions.

In certain aspects, the DCA adaptive controller may be implemented with the hamming code-based FSM state encoding to detect the invalid state transitions. This may prevent the DCC adaptive controller to send any incorrect duty cycle adjustment input to the DCAs.

In certain aspects, one or more configuration registers of the first DCA may be implemented with two dimensional (2D) parity protection codes for 2D parity protection.

In certain aspects, one or more configuration registers of the second DCA may be implemented with the 2D parity protection codes for the 2D parity protection.

In certain aspects, one or more configuration registers of the DCM may be implemented with the 2D parity protection codes for the 2D parity protection.

In certain aspects, one or more configuration registers of the DCA adaptive controller may be implemented with the 2D parity protection codes for the 2D parity protection.

In certain aspects, the one or more configuration registers of the first DCA may include a random hardware fault. In certain aspects, the one or more configuration registers of the second DCA may include the random hardware fault. In certain aspects, the one or more configuration registers of the DCM may include the random hardware fault.

In certain aspects, an end-to-end system self-checking test may detect first DCA, the second DCA, and the DCM configuration registers random hardware faults such as stuck-at faults. For example, a clock cycle monitoring circuit may be coupled to the DCC. The clock cycle monitoring circuit may detect an incorrect operation due to any random hardware fault during the self-checking test.

In certain aspects, the DCD measurements of the distorted duty cycle of the clock signal measured and outputted by the DCM to the DCA adaptive controller may be incorrect due to the random hardware fault in the configuration registers of the first DCA, the second DCA, and/or the DCM. In such cases, the DCA adaptive controller may detect the stuck-at faults at the DCM based on processing of incorrect DCD measurements of the distorted duty cycle of the clock signal during the self-checking test. That is, the end-to-end system self-checking test may detect the DCM output stuck-at faults.

In certain aspects, the DCM may measure the duty cycle of the clock signal before and after adjustment at first DCA and/or the second DCA to verify the corrected duty cycle of the clock signal. For example, the DCM may measure the distorted duty cycle of the clock signal before adjustment at the second DCA. The DCM may also measure the corrected duty cycle of the clock signal after the adjustment at the second DCA.

In certain aspects, the DCM may verify that the distorted duty cycle of the clock signal has been corrected based on determining differences between measurements of the distorted duty cycle and measurements of the corrected duty cycle.

In certain aspects, a software sequence may be performed after the end-to-end system self-checking test. For example, a software may configure the DCC hardware at boot. The software may trigger initial DCM measurement of the distorted duty cycle of the clock signal and the second DCA duty cycle correction of the distorted duty cycle of the clock signal. The software may then explicitly perform another DCM measurement to verify the corrected duty cycle of the clock signal.

In certain aspects, the DCM may measure the duty cycle before and after a DCA adjustment to verify the corrected duty cycle and an ungated clock. For example, a clock for several cycles of the clock signal may be gated. The DCM may measure the distorted duty cycle of the clock signal before adjustment at the second DCA. The DCM may also measure the corrected duty cycle of the clock signal after the adjustment at the second DCA. The DCM may verify that the distorted duty cycle of the clock signal has been corrected and the clock has been ungated, based on determining differences between measurements of the distorted duty cycle and measurements of the corrected duty cycle.

In certain aspects, a clock cycle monitoring circuit may be coupled to the DCC. The clock cycle monitoring circuit may detect a gated clock during a self-checking test.

Example DCA Operation

FIG. 7 is a diagram 700 showing exemplary implementation of a DCA. The DCA may be the first DCA or the second DCA of FIG. 6. The DCA may have a signal input, control inputs (e.g., a first control input, a second control input), and an output. The DCA may be configured to receive a clock signal at its signal input (e.g., from a clock generator), adjust a duty cycle of the clock signal, and output the clock signal after duty cycle adjustment at its output. The DCA may be capable of increasing or decreasing the duty cycle of the clock signal. So, the DCA may support duty cycle adjustments in either direction.

The DCA may include a high-phase extender. The DCA may also include multiple inverters (e.g., a first inverter, a second inverter) and multiple multiplexers (e.g., a first multiplexer (e.g., such as a first XOR that may perform multiplexing function), a second multiplexer (e.g., such as a second XOR that may perform multiplexing function)) coupled to each other and the high-phase extender. As used herein, an "inverter" covers any circuit implementation that can perform the inverting function such as using a NAND gate, a complementary metal-oxide semiconductor (CMOS) inverter, or any logic gate or combination of logic gates that can perform the inverting function. As used herein, a "multiplexer" covers any circuit implementation that can perform the multiplexing function such as using XOR gate or any logic gate or a combination of logic gates that can perform the multiplexing function.

The high-phase extender may have a signal input, a control input, and an output. The signal input of the high-phase extender may be coupled to an output of one of the multiplexers, and the control input of the high-phase extender may be coupled to one of the control inputs of the DCA. The high-phase extender may be configured to extend a high phase of a clock signal by an adjustable amount based on a phase control signal received at its control input.

To increase the duty cycle of the clock signal input to the DCA, one of the multiplexers may pass the clock signal from the clock generator to the signal input of the high-phase extender. The high-phase extender then extends the high phase of the clock signal by an adjustable amount based on a phase control signal received from a duty cycle control circuit. By extending the high phase of the clock signal, the high-phase extender increases the duty cycle of the clock signal. The larger the amount of high-phase extension by the high-phase extender, the larger the increase in the duty cycle of the clock signal.

To decrease the duty cycle of the clock signal input to the DCA, one of the inverters may invert the clock signal from the clock generator and one of the multiplexers may pass the inverted clock signal to the signal input of the high-phase extender. The high-phase extender then extends the high phase of the inverted clock signal by an adjustable amount based on a phase control signal received from the duty cycle control circuit. In this case, extending the high phase of the inverted clock signal is equivalent to extending the low phase of the clock signal, which decreases the duty cycle of the clock signal. The larger the amount by which the high-phase extender extends the high phase of the inverted clock signal, the larger the decrease in the duty cycle of the clock signal.

So, the DCA is capable of increasing or decreasing the duty cycle of the clock signal. To increase the duty cycle of the clock signal, the high-phase extender extends the high phase of the clock signal. To decrease the duty cycle of the clock signal, the clock signal is first inverted and the high-phase extender extends the high phase of the inverted clock signal (which is equivalent to extending the low phase of the clock signal). An inverter inverts the inverted clock signal back into the clock signal. For applications where only high-phase extension is used, the multiplexers and the inverters may be omitted.

Example DCM Operation

In certain aspects, a DCM (e.g., the DCM of FIG. 6) may include a flip-flop, a ring oscillator, and/or a counter. The flip-flop may have a signal input configured to receive the clock signal (e.g., with the distorted duty cycle from the first DCA), a clock input, and an output. The ring oscillator may have an enable input and an output. The counter may have a target input, a count input, an enable input, and an output.

The DCM may measure a high phase of the clock signal (i.e., a duration that the clock signal is high during one clock period). To do this, the ring oscillator may be enabled by inputting an enable signal to the enable input of the ring oscillator. This causes the ring oscillator to generate a ring oscillator (RO) signal that oscillates at a frequency of the ring oscillator. The ring oscillator outputs the RO signal at the output of the ring oscillator, which is coupled to the clock input of the flip-flop and the count input of the counter.

The flip-flop may be clocked by the RO signal. The flip-flop may be configured to latch a logic state of the clock signal on rising edges of the RO signal, and output the latched logic state of the clock signal to the enable input of the counter. The flip-flop latches a one when the clock signal is high, and therefore outputs a one to the enable input of the counter for a duration approximately equal to a high phase of the clock signal.

The counter may count a number of oscillations of the RO signal at the count input while the flip-flop outputs a one to the enable input of the counter. Since the flip-flop outputs a one to the enable input of the counter for a duration approximately equal to the high phase of the clock signal, the counter counts the number of oscillations of the RO signal in the high phase of the clock signal. As a result, the count value of the counter provides a measurement of the high phase of the clock signal (i.e., the duration that the clock signal is high during one clock period).

The counter may receive a target count value at the target input, in which the target count value indicates a count value for a target high phase corresponding to a target duty cycle (e.g., 50% duty cycle). The counter then compares the count value from the RO signal with the target count value to determine whether the duty cycle of the clock signal is above or below the target duty cycle, and outputs a signal at the output based on the comparison indicating whether to increase or decrease the duty cycle of the clock signal to compensate for DCD.

In certain aspects, a DCM may have an input and an output. The DCM may be configured to receive the clock signal via its input. In one example, the input may be coupled to the leaf node of the clock distribution network. However, it is to be appreciated that the input may be coupled to another node (e.g., a node before the clock distribution network, a node within the clock distribution network, etc.). The DCM may be configured to output the measurement signal at its output.

The DCM may also include a measurement control circuit, a launch circuit, a delay circuit, a time-to-digital converter (TDC), and/or a capture circuit. The measurement control circuit controls operations of the DCM.

The launch circuit may have an enable input, a clock input, a control input, and an output. The launch circuit may be configured to receive an enable signal from the measurement control circuit via the enable input to initiate a measurement. In response to the enable signal, the launch circuit launches (i.e., outputs) an edge of a timing signal at the output on an edge of the clock signal. The edge of the clock signal used to launch the edge of the timing signal may be a rising edge or a falling edge.

The launch circuit may select the edge of the clock signal used to launch the edge of the timing signal based on a first edge select signal received from the measurement control circuit via the control input. For example, the launch circuit may launch the edge of the timing signal on a rising edge of the clock signal if the first edge select signal has a first logic value and launch the edge of the timing signal on a falling edge of the clock signal if the first edge select signal has a second logic value. The first logic value may be one and the second logic value may be zero, or vice versa. The edge of the timing signal may be a rising edge or a falling edge.

The delay circuit may have a signal input, a control input, and an output. The signal input is coupled to the output of the launch circuit. The control input is coupled to an output of the measurement control circuit. The delay circuit is configured to receive the edge of the timing signal from the launch circuit via the signal input, delay the edge of the timing signal by a time delay, and output the delayed edge of the timing signal at the output. The time delay of the delay circuit is adjustable (i.e., programmable). The delay circuit may be configured to set the time delay of the delay circuit based on a delay control signal received from the measurement control circuit via the control input.

The capture circuit may have a clock input, a control input, and an output. The clock input is coupled to the input of the timing measurement circuit to receive the clock signal, and the control input is coupled to the output of the measurement control circuit. The capture circuit is configured to generate a capture signal and output the capture signal at the output. The capture circuit may be configured to output an edge of the capture signal on a rising edge or a falling edge of the clock signal based on a second edge select signal received from the measurement control circuit via the control input. For example, the capture circuit may output the edge of the capture signal on a rising edge of the clock signal if the second edge select signal has a first logic value and output the edge of the capture signal on a falling edge of the clock signal if the second edge select signal has a second logic value. The first logic value may be one and the second logic value may be zero, or vice versa. The edge of the capture signal may be a rising edge or a falling edge.

The TDC may have a signal input, a capture input, and an output. The signal input of the TDC is coupled to the output of the delay circuit to receive the delayed edge of the timing signal from the delay circuit. The capture input is coupled to the output of the capture circuit to receive the edge of the capture signal from the capture circuit. The output of the TDC is coupled to a time-measurement input of the measurement control circuit. The TDC is configured to measure the time delay (i.e., elapsed time) between the time the TDC receives the edge of the timing signal at the signal input and the time the TDC receives the edge of the capture signal at the capture input, and output a digital time-measurement signal at the output indicating the measured time delay. The time delay measurement may start on the edge of the timing signal and stop on the edge of the capture signal.

The measurement control circuit may measure various parameters of the clock signal (e.g., with the distorted duty cycle) by selecting the edge of the clock signal used to launch the edge of the timing signal using the first edge select signal and selecting the edge of the clock signal used to output the edge of the capture signal using the second edge select signal.

The measurement control circuit may measure a high phase of the clock signal (e.g., with the distorted duty cycle) by selecting a rising edge of the clock signal to launch the edge of the timing signal and selecting a falling edge of the clock signal to output the edge of the capture signal. The high phase is the time duration that the clock signal is high (i.e., one) during one clock period. The high phase starts at the rising edge of the clock signal and ends at the falling edge of the clock signal.

The measurement control circuit may measure a low phase of the clock signal (e.g., with the distorted duty cycle) by selecting a falling edge of the clock signal to launch the edge of the timing signal and selecting a rising edge of the clock signal to output the edge of the capture signal. The low phase is the time duration that the clock signal is low during one clock period. The low phase starts at the falling edge of the clock signal and ends at the rising edge of the clock signal. The low phase is equal to the sum of the time delay of the delay circuit and the time delay measured by the TDC.

The measurement control circuit may measure a period of the clock signal (e.g., with the distorted duty cycle) by selecting a first rising edge of the clock signal to launch the edge of the timing signal and selecting a second rising edge of the clock signal to output the edge of the capture signal. The period of the clock signal may be approximately equal to the sum of the time delay of the delay circuit and the time delay measured by the TDC. This is because the clock period is approximately equal to the time delay from the time the edge of the timing signal is launched on the first rising edge of the clock signal and the time the edge of the capture signal is output on the second rising edge of the clock signal, which is approximately equal to the sum of the time delay of the delay circuit and the time delay measured by the TDC.

The measurement control circuit may measure the period of the clock signal by selecting a first falling edge of the clock signal to launch the edge of the timing signal and selecting a second falling edge of the clock signal to output the edge of the capture signal. The period of the clock signal is approximately equal to the sum of the time delay of the delay circuit and the time delay measured by the TDC.

The measurement control circuit may measure any one of one or more parameters of the clock signal (e.g., with the distorted duty cycle) including the high phase of the clock signal, the low phase of the clock signal, and the period of the clock signal. The measurement control circuit selects the parameter to be measured by selecting the launch clock edge (i.e., the edge of the clock signal used to launch the edge of the timing signal) and selecting the capture clock edge (i.e., the edge of the clock signal used to output the edge of the capture signal) accordingly. For example, to measure the high phase, the measurement control circuit selects a rising edge of the clock signal for the launch clock edge, and selects a falling edge of the clock signal for the capture clock edge. The launch clock edge may also be referred to as a first edge of the clock signal and the capture clock edge may also be referred to as a second edge of the clock signal.

The measurement control circuit may be configured to generate the measurement signal based on the one or more measured parameters of the clock signal, and output the measurement signal. The measurement signal may indicate one or more of the measured high phase of the clock signal, the measured low phase of the clock signal, and the measured period of the clock signal. The measurement signal may also indicate DCD measurements of the distorted duty cycle of the clock signal.

The measurement control circuit may determine a duty cycle of the clock signal based on two or more of the measured high phase of the clock signal, the measured low phase of the clock signal, and the measured period of the clock signal. For example, the measurement control circuit may determine the duty cycle of the clock signal based on a ratio of the measured high phase of the clock signal and the measured period of the clock signal. The measurement control circuit may then output the measurement signal indicating the determined duty cycle.

The measurement control circuit may determine a duty cycle adjustment for the clock signal (e.g., with the distorted duty cycle) based on one or more of the measured high phase of the clock signal, the measured low phase of the clock signal, and the measured period of the clock signal. For example, the clock signal may have a target duty cycle of 50%. In this example, the measurement control circuit may compare the measured high phase of the clock signal with the measured low phase of the clock signal to determine the duty cycle adjustment. For example, if the measured high phase is greater than the measured low phase (which occurs when the duty cycle of the clock signal is greater than the target duty cycle of 50%), then the measurement control circuit may determine a duty cycle adjustment that decreases the duty cycle of the clock signal to move the duty cycle of the clock signal closer to the target duty cycle of 50%. If, on the other hand, the measured high phase is less than the measured low phase (which occurs when the duty cycle of the clock signal is less than the target duty cycle), the measurement control circuit may determine a duty cycle adjustment that increases the duty cycle of the clock signal to move the duty cycle of the clock signal closer to the target duty cycle of 50%. The measurement control circuit may then output the measurement signal indicating the determined duty-cycle adjustment.

Example DCA Adaptive Controller Operation

In certain aspects, a DCA adaptive controller (e.g., the DCA adaptive controller of FIG. 6) may receive the measurement signal from the DCM, determine a duty cycle adjustment (e.g., a duty cycle correction value for the distorted duty cycle of the clock signal) to be applied by the second DCA based on the measurement signal, and set the duty cycle adjustment of the distorted duty cycle of the clock signal at the second DCA based on the determined duty cycle correction value. The second DCA may increase the duty cycle of the clock signal, based on the determined duty cycle correction value, by increasing the high phase of the clock signal or decreasing the low phase of the clock signal. The second DCA may decrease the duty cycle of the clock signal, based on the determined duty cycle correction value, by decreasing the high phase of the clock signal or increasing the low phase of the clock signal.

For the example where the measurement signal indicates the measured high phase of the clock signal, the DCA adaptive controller may compare the measured high phase with a target high phase corresponding to a target duty cycle (e.g., 50% duty cycle). If the measured high phase is greater than the target high phase (which occurs when the duty cycle of the clock signal is greater than the target duty cycle), then the DCA adaptive controller may determine the duty cycle adjustment to be applied by the second DCA that decreases the duty cycle of the clock signal. If, on the other hand, the measured high phase is less than the target high phase (which occurs when the duty cycle of the clock signal is less than the target duty cycle), then the DCA adaptive controller may determine the duty cycle adjustment to be applied by the second DCA that increases the duty cycle of the clock signal.

For the example where the measurement signal indicates the measured low phase of the clock signal, the DCA adaptive controller may compare the measured low phase with a target low phase corresponding to a target duty cycle (e.g., 50% duty cycle). If the measured low phase is greater than the target low phase (which occurs when the duty cycle of the clock signal is less than the target duty cycle), then the DCA adaptive controller may determine the duty cycle adjustment to be applied by the second DCA that increases the duty cycle of the clock signal. If, on the other hand, the measured low phase is less than the target low phase (which occurs when the duty cycle of the clock signal is greater than the target duty cycle), then the DCA adaptive controller may determine the duty cycle adjustment to be applied by the second DCA that decreases the duty cycle of the clock signal.

For the example where the measurement signal indicates both the measured high phase of the clock signal and the measured low phase of the clock signal, and the target duty cycle is 50%, the DCA adaptive controller may compare the measured high phase with the measured low phase of the clock signal to determine the duty cycle adjustment. For example, if the measured high phase is greater than the measured low phase (which occurs when the duty cycle of the clock signal is greater than the target duty cycle of 50%), then the DCA adaptive controller may determine the duty cycle adjustment that decreases the duty cycle of the clock signal. If, on the other hand, the measured high phase is less than the measured low phase (which occurs when the duty cycle of the clock signal is less than the target duty cycle), then the DCA adaptive controller may determine the duty cycle adjustment that increases the duty cycle of the clock signal.

For the example where the measurement signal indicates the duty cycle of the clock signal, the DCA adaptive controller may compare the indicated duty cycle with a target duty cycle to determine the duty cycle adjustment. For example, if the indicated duty cycle is greater than the target duty cycle, then the DCA adaptive controller may determine the duty cycle adjustment that decreases the duty cycle of the clock signal. If the indicated duty cycle is less than the target duty cycle, then the DCA adaptive controller may determine the duty cycle adjustment that increases the duty cycle of the clock signal.

Example DCC Operation

In certain aspects, a DCC (e.g., the DCC of FIG. 6) may monitor the duty cycle of the clock signal at the leaf node using the DCM, and adjusts the duty cycle of the clock signal based on the measurement signal from the DCM to compensate for the DCD in the clock distribution network. The DCC may perform the duty-cycle adjustment each time a system (e.g., such as the vehicle control system 102 of FIG. 1) is booted. In some cases, the DCC may perform the duty-cycle adjustment during system idle durations. In some cases, the DCC may perform the duty-cycle adjustment during subsystem (e.g., within the vehicle control system 102 of FIG. 1) idle durations.

The DCC may monitor the duty cycle of the clock signal at one leaf node using the DCM. In this example, there may be a high correlation between the duty cycle distortion at the leaf node coupled to the DCM and the DCD at each of the other leaf nodes. However, it is to be appreciated that the DCC is not limited to this example. In another example, the DCC may include multiple DCMs, in which each of the DCMs is coupled to a respective leaf node for monitoring the duty cycle of the clock signal at the respective leaf node.

It is to be appreciated that the DCM is not limited to being coupled to the leaf node. For example, in some applications, the DCM may be coupled to a node located before the clock distribution network or a node located within the clock distribution network. This may be done, for example, to provide duty cycle compensation for another effect that causes the DCD of the clock signal besides the aging effect in the clock distribution network. In one example, the clock generator may introduce the DCD into the clock signal. To provide compensation for the DCD in the clock generator, the DCM may be coupled to the output of the first DCA before the ACD system. In another example, the DCM may be coupled to a node within the ACD system to provide duty cycle compensation within the ACD system. Thus, it is to be appreciated that the DCM may be coupled to any one of a number of nodes in a system to provide the duty cycle compensation for various effects in the system that cause the DCD.

Example Method for a Self-Checking Test

FIG. 8 shows an example of a method 800 for a self-checking test. The method 800 may be performed by one or more devices of the DCC, as described herein with respect to FIG. 6.

Method 800 begins at 810 with adjusting by each of a plurality of DCAs (e.g., including a first DCA and a second DCA) a duty cycle of a clock signal and outputting the clock signal with an adjusted duty cycle.

Method 800 then proceeds to 820 with measuring by a DCM (e.g., which may be coupled to the first DCA and the second DCA) a DCD of the duty cycle of the clock signal and/or duty cycle adjustments performed by the plurality of DCAs.

In certain aspects, the method 800 further includes performing (e.g., by the first DCA) distortion of the duty cycle of the clock signal and outputting the clock signal with a distorted duty cycle.

In certain aspects, the method 800 further includes determining (e.g., by the DCM) the DCD based on measuring of one or more parameters of the distorted duty cycle of the clock signal and outputting DCD measurements of the distorted duty cycle of the clock signal to a DCA adaptive controller. In one example, the one or more parameters may include a high phase of the clock signal. In another example, the one or more parameters may include a low phase of the clock signal. In yet another example, the one or more parameters may include a period of the clock signal.

In certain aspects, the method 800 further includes determining (e.g., by the DCA adaptive controller) a duty cycle correction value based on the DCD measurements of the distorted duty cycle of the clock signal (e.g., which may be received from the DCM) and outputting the duty cycle correction value to the second DCA.

In certain aspects, the method 800 further includes adjusting (e.g., by the second DCA) the distorted duty cycle of the clock signal (e.g., which may be received from the first DCA) to a corrected duty cycle of the clock signal, based on the duty cycle correction value received from the DCA adaptive controller.

In certain aspects, the method 800 further includes measuring (e.g., by the DCM) the corrected duty cycle of the clock signal (e.g., which may be received from the second DCA) and determining that the corrected duty cycle of the clock signal is same as an expected duty cycle of the clock signal.

The various operations of methods described above may be performed by any suitable means capable of performing the corresponding functions. The means may include various hardware and/or software component(s) and/or module (s), including, but not limited to a circuit, an application specific integrated circuit (ASIC), or a processor.

Example Clauses

Implementation examples are described in the following numbered clauses:

Clause 1: A method for a self-checking test, comprising: adjusting, by each of a plurality of duty cycle adjusters (DCAs) comprising at least a first DCA and a second DCA, a duty cycle of a clock signal and output the clock signal with an adjusted duty cycle; and measuring, by a duty cycle monitor (DCM) coupled to the plurality of DCAs, duty cycle distortion (DCD) of the duty cycle of the clock signal and duty cycle adjustments performed by the plurality of DCAs.

Clause 2: The method of clause 1, further comprising: performing, by the first DCA, distortion of the duty cycle of the clock signal and outputting the clock signal with a distorted duty cycle; determining, by the DCM, the DCD based on measuring of one or more parameters of the distorted duty cycle of the clock signal and outputting DCD measurements of the distorted duty cycle of the clock signal; determining, by a DCA adaptive controller, a duty cycle correction value based on the DCD measurements of the distorted duty cycle of the clock signal received from the DCM and outputting the duty cycle correction value; and adjusting, by the second DCA, the distorted duty cycle of the clock signal to a corrected duty cycle of the clock signal based on the duty cycle correction value received from the DCA adaptive controller.

Clause 3: The method of clause 2, further comprising: measuring, by the DCM, the corrected duty cycle of the clock signal; and determining, by the DCM, that the corrected duty cycle of the clock signal is same as an expected duty cycle of the clock signal.

Clause 4: The method of clause 2, wherein the one or more parameters comprise at least one of a high phase of the clock signal, a low phase of the clock signal, or a period of the clock signal.

Clause 5: An apparatus, comprising: a memory comprising instructions; and one or more processors configured, individually or in any combination, to execute the instructions and cause the apparatus to perform a method in accordance with any one of Clauses 1-4.

Clause 6: An apparatus, comprising means for performing a method in accordance with any one of Clauses 1-4.

Clause 7: A non-transitory computer-readable medium comprising executable instructions that, when executed by one or more processors of an apparatus, cause the apparatus to perform a method in accordance with any one of Clauses 1-4.

Clause 8: A computer program product embodied on a computer-readable storage medium comprising code for performing a method in accordance with any one of Clauses 1-4.

Additional Considerations

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An apparatus, comprising:

a plurality of duty cycle adjusters (DCAs) comprising at least a first DCA and a second DCA, wherein each DCA of the plurality of DCAs is configured to adjust a duty cycle of a clock signal and output the clock signal with an adjusted duty cycle; and a duty cycle monitor (DCM) coupled to the plurality of DCAs, wherein the DCM is configured to measure duty cycle distortion (DCD) of the duty cycle of the clock signal and duty cycle adjustments performed by the plurality of DCAs, and wherein the first DCA is configured to induce the DCD of the clock signal, the second DCA is configured to correct the duty cycle of the clock signal, and the DCM is configured to measure the duty cycle of the clock signal before and after correction by the second DCA.

2. The apparatus of claim 1, wherein:

the first DCA is configured to perform distortion of the duty cycle of the clock signal and output the clock signal with a distorted duty cycle;

the DCM coupled to the first DCA, wherein the DCM is configured to determine the DCD based on measuring one or more parameters of the distorted duty cycle of the clock signal and output DCD measurements of the distorted duty cycle of the clock signal;

a DCA adaptive controller coupled to the first DCA and the DCM, wherein the DCA adaptive controller is configured to determine a duty cycle correction value based on the DCD measurements of the distorted duty cycle of the clock signal received from the DCM and output the duty cycle correction value; and the second DCA coupled to the first DCA, the DCM and the DCA adaptive controller, wherein the second DCA is configured to adjust the distorted duty cycle of the clock signal to a corrected duty cycle of the clock signal based on the duty cycle correction value received from the DCA adaptive controller.

3. The apparatus of claim 2, wherein the DCM is coupled to the first DCA through a clock path between the first DCA and the DCM.

4. The apparatus of claim 3, wherein the second DCA is either before the first DCA or after the first DCA in the clock path.

5. The apparatus of claim 2, wherein the DCM is configured to measure the corrected duty cycle of the clock signal and determine that the corrected duty cycle of the clock signal is same as an expected duty cycle of the clock signal.

6. The apparatus of claim 2, wherein the one or more parameters comprise at least one of a high phase of the clock signal, a low phase of the clock signal, or a period of the clock signal.

7. The apparatus of claim 2, wherein at least one of the first DCA, the second DCA, the DCM or the DCA adaptive controller is implemented with a hamming code-based finite state machine (FSM) state encoding.

8. The apparatus of claim 2, wherein one or more configuration registers of at least one of the first DCA, the second DCA, the DCM or the DCA adaptive controller are implemented with two dimensional (2D) parity protection codes.

9. The apparatus of claim 2, wherein:

one or more configuration registers of at least one of the first DCA, the second DCA, or the DCM comprise a random hardware fault;

the DCD measurements of the distorted duty cycle of the clock signal measured and outputted by the DCM to the DCA adaptive controller are incorrect due to the random hardware fault in the one or more configuration registers of at least one of the first DCA, the second DCA, or the DCM; and the DCA adaptive controller is configured to detect stuck-at faults at the DCM based on processing of incorrect DCD measurements of the distorted duty cycle of the clock signal during a self-checking test at the apparatus.

10. The apparatus of claim 2, wherein the DCM is configured to:

measure the distorted duty cycle of the clock signal before adjustment at the second DCA;

measure the corrected duty cycle of the clock signal after the adjustment at the second DCA; and verifying that the distorted duty cycle of the clock signal has been corrected based on determining differences between measurements of the distorted duty cycle and measurements of the corrected duty cycle.

11. The apparatus of claim 2, wherein a clock for several cycles of the clock signal is gated.

12. The apparatus of claim 11, wherein the DCM is configured to:

measure the distorted duty cycle of the clock signal before adjustment at the second DCA;

measure the corrected duty cycle of the clock signal after the adjustment at the second DCA; and verify that the distorted duty cycle of the clock signal has been corrected and the clock has been ungated, based on determining differences between measurements of the distorted duty cycle and measurements of the corrected duty cycle.

13. The apparatus of claim 11, wherein a clock cycle monitoring circuit is coupled to the apparatus, and wherein the clock cycle monitoring circuit is configured to detect a gated clock during a self-checking test at the apparatus.

14. The apparatus of claim 1, wherein at least one of the plurality of DCAs is configured to limit an adjustment of the duty cycle of the clock signal based on a threshold duty cycle correction value.

15. The apparatus of claim 1, wherein:

one or more configuration registers of at least one of the first DCA, the second DCA, or the DCM comprise a random hardware fault; and a clock cycle monitoring circuit is coupled to the apparatus, wherein the clock cycle monitoring circuit is configured to detect an incorrect operation at the apparatus due to the random hardware fault during a self-checking test at the apparatus.

16. A method for a self-checking test, comprising:

adjusting, by each of a plurality of duty cycle adjusters (DCAs) comprising at least a first DCA and a second DCA, a duty cycle of a clock signal and output the clock signal with an adjusted duty cycle; and measuring, by a duty cycle monitor (DCM) coupled to the plurality of DCAs, duty cycle distortion (DCD) of the duty cycle of the clock signal and duty cycle adjustments performed by the plurality of DCAs, wherein the first DCA induces the DCD of the clock signal, the second DCA corrects the duty cycle of the clock signal, and the DCM measures the duty cycle of the clock signal before and after correction by the second DCA.

17. The method of claim 16, further comprising:

performing, by the first DCA, distortion of the duty cycle of the clock signal and outputting the clock signal with a distorted duty cycle;

determining, by the DCM, the DCD based on measuring of one or more parameters of the distorted duty cycle of the clock signal and outputting DCD measurements of the distorted duty cycle of the clock signal;

determining, by a DCA adaptive controller, a duty cycle correction value based on the DCD measurements of the distorted duty cycle of the clock signal received from the DCM and outputting the duty cycle correction value; and adjusting, by the second DCA, the distorted duty cycle of the clock signal to a corrected duty cycle of the clock signal based on the duty cycle correction value received from the DCA adaptive controller.

18. The method of claim 17, further comprising:

measuring, by the DCM, the corrected duty cycle of the clock signal; and determining, by the DCM, that the corrected duty cycle of the clock signal is same as an expected duty cycle of the clock signal.

19. The method of claim 17, wherein the one or more parameters comprise at least one of a high phase of the clock signal, a low phase of the clock signal, or a period of the clock signal.

20. An apparatus for a self-checking test, comprising:

means for adjusting a duty cycle of a clock signal and output the clock signal with an adjusted duty cycle; and means for measuring duty cycle distortion (DCD) of the duty cycle of the clock signal and duty cycle adjustments performed by a plurality of duty cycle adjusters (DCAs), wherein the DCD of the clock signal is induced, the duty cycle of the clock signal is corrected, and the duty cycle of the clock signal is measured before and after the correction.

* * * * *